United States Patent
Braithwaite

(10) Patent No.: US 7,149,257 B2
(45) Date of Patent: Dec. 12, 2006

(54) DIGITAL PREDISTORTION SYSTEM AND METHOD FOR CORRECTING MEMORY EFFECTS WITHIN AN RF POWER AMPLIFIER

(75) Inventor: Richard Neil Braithwaite, Orange, CA (US)

(73) Assignee: Powerwave Technologies, Inc., Santa Ana, CA (US)

(*) Notice: Subject to any disclaimer, the term of this patent is extended or adjusted under 35 U.S.C. 154(b) by 0 days.

(21) Appl. No.: 10/881,476

(22) Filed: Jun. 30, 2004

(65) Prior Publication Data

US 2005/0001684 A1    Jan. 6, 2005

Related U.S. Application Data

(60) Provisional application No. 60/485,246, filed on Jul. 3, 2003.

(51) Int. Cl.
   *H04K 1/02* (2006.01)
(52) U.S. Cl. .................................................. 375/296
(58) Field of Classification Search ................ 375/285, 375/295, 296, 297; 455/63.1, 114.2, 114.3, 455/126, 127.1, 127.2; 330/2, 149; 395/296
   See application file for complete search history.

(56) References Cited

U.S. PATENT DOCUMENTS

| | | | | |
|---|---|---|---|---|
| 4,291,277 A | * | 9/1981 | Davis et al. ................. | 330/149 |
| 5,049,832 A | | 9/1991 | Cavers ........................ | 330/149 |
| 5,742,201 A | * | 4/1998 | Eisenberg et al. ............. | 330/2 |
| 5,867,065 A | | 2/1999 | Leyendecker ................ | 330/149 |
| 5,903,611 A | * | 5/1999 | Schnabl et al. ............. | 375/297 |
| 5,923,712 A | | 7/1999 | Leyendecker et al. ...... | 375/297 |
| 5,959,500 A | | 9/1999 | Garrido ....................... | 330/151 |
| 6,108,385 A | | 8/2000 | Worley, III ................. | 375/296 |
| 6,141,390 A | | 10/2000 | Cova .......................... | 375/297 |
| 6,194,942 B1 | | 2/2001 | Yu et al. ..................... | 327/317 |
| 6,275,685 B1 | * | 8/2001 | Wessel et al. ............... | 455/126 |
| 6,377,116 B1 | | 4/2002 | Mattsson et al. ............. | 330/2 |
| 6,512,417 B1 | | 1/2003 | Booth et al. ................ | 330/149 |
| 6,591,090 B1 | | 7/2003 | Vuorio et al. ............... | 455/126 |
| 6,600,792 B1 | | 7/2003 | Antonio et al. ............. | 375/297 |
| 6,731,168 B1 | | 5/2004 | Hedberg et al. ............ | 330/149 |
| 6,794,939 B1 | * | 9/2004 | Kim et al. ................... | 330/149 |
| 2002/0171485 A1 | | 11/2002 | Cova ........................... | 330/149 |
| 2003/0053552 A1 | | 3/2003 | Hongo et al. ............... | 375/295 |
| 2003/0058959 A1 | | 3/2003 | Rafie et al. ................. | 375/296 |
| 2003/0222712 A1 | | 12/2003 | Kim et al. ................... | 330/149 |
| 2003/0223508 A1 | | 12/2003 | Ding et al. ................. | 375/296 |
| 2004/0017257 A1 | | 1/2004 | Kim ........................... | 330/149 |
| 2004/0179629 A1 | | 9/2004 | Song et al. ................. | 375/296 |

* cited by examiner

*Primary Examiner*—Kevin Kim
(74) *Attorney, Agent, or Firm*—David L. Henty; Myers Dawes Andras & Sherman LLP

(57) ABSTRACT

A system and method of correcting memory effects present within power amplifiers using digital predistortion and an improved power amplifier system employing digital predistortion are disclosed. Nonlinearities within a power amplifier having an input derived from a digital signal are compensated by injecting a digital correction signal prior to the power amplifier. A system and method for modeling the distortion created by power amplifier memory effects and generating the desired digital predistortion correction signal are disclosed.

47 Claims, 15 Drawing Sheets

DIGITAL PREDISTORTION SYSTEM AND METHOD FOR CORRECTING MEMORY EFFECTS WITHIN AN RF POWER AMPLIFIER

RELATED APPLICATION INFORMATION

The present application claims priority under 35 USC 119 (e) to provisional application Ser. No. 60/485,246 filed Jul. 3, 2003, the disclosure of which is incorporated herein by reference its entirety.

FIELD OF THE INVENTION

The present invention relates to linearization of RF power amplifiers. More particularly, the present invention relates to digital predistortion linearization of RF power amplifiers.

BACKGROUND OF THE INVENTION

In the RF transmission of digital information, sampled data sequences are converted to analog signals and processed, subsequently, by various operations containing unwanted nonlinearities. The primary source of nonlinearity is the power amplifier (PA). Nonlinear behavior of the PA (or other devices) can be compensated using digital predistortion. That is, the correction signal is a sampled sequence applied prior to the PA. The correction signal, denoted by $x_{DPD}(nT)$, is represented as a set of higher-order sub-signals corresponding to nonlinear modes in the transmitter.

The nonlinear behaviour of the PA transfer characteristics can be classified as memoryless or memory-based. For a memoryless nonlinear device, the nonlinear modes are functions of the instantaneous input value, x(t), only. In contrast, for a PA exhibiting memory effects, the nonlinear modes are functions of both instantaneous and past input values. In general, memory effects exist in any PA; however, the effect becomes more apparent when the bandwidth of the input signal is large. As a result, the correction of memory effects is becoming increasingly more important as wide bandwidth modulation formats are put in use.

Accordingly a need presently exists for a system and method for correcting distortion in power amplifiers and especially distortion due to memory effects.

SUMMARY OF THE INVENTION

In a first aspect the present invention provides a digital predistorter adapted to receive a digital input signal and output a predistorted digital signal. The digital predistorter comprises an input coupled to receive the digital input signal. A first signal path is coupled to the input and comprises a delay circuit and a combiner circuit coupled to the output of the delay circuit. A second signal path is coupled to the input in parallel with the first signal path and comprises a first digital predistorter circuit providing a first predistortion operation on the input signal. A third signal path is coupled to the input in parallel with the first and second signal path and comprises a second digital predistorter circuit providing a second different predistortion operation on the input signal. The combiner circuit receives and combines the outputs of the first and second digital predistorter circuits with the output of the delay circuit of the first signal path to provide a predistorted digital output signal.

In a preferred embodiment the first digital predistorter circuit provides the first predistortion operation modeling memoryless distortion effects employing only a current sample of the digital input signal. The second digital predistorter circuit provides the second predistortion operation modeling memory distortion effects employing plural samples of the digital input signal. The combiner circuit preferably comprises a complex addition circuit. The digital predistorter may further comprise a second combiner circuit, coupled to the outputs of the first and second digital predistorter circuits, and providing a combined output of the first and second digital predistorter circuits to the combiner circuit in the first signal path. The second combiner circuit preferably comprises a complex addition circuit.

According to another aspect the present invention provides a digital predistortion circuit adapted to receive a digital input signal and output a digital predistortion correction signal compensating for memory effects due to plural samples of the input signal. The digital predistortion circuit comprises an input for receiving the digital input signal. The digital predistortion circuit further comprises a first signal path comprising a delay circuit coupled to the input and a combiner circuit coupled to the output of the delay circuit. The digital predistortion circuit further comprises a filter bank, coupled to the input and configured in parallel with the first signal path, comprising at least two filters having different frequency responses and outputting at least first and second band limited signals derived from plural samples of the digital input signal. A plurality of nonlinear operation circuits are coupled to the filter bank and receive the band limited signals, the nonlinear operation circuits creating higher order signals from the band limited signals. The outputs of the nonlinear operation circuits are provided to the combiner circuit in the first signal path and combined with the delayed input signal output from the delay circuit in the first signal path to provide a digital predistortion output signal.

In a preferred embodiment the digital predistortion circuit may further comprise a plurality of weighting circuits coupled to the outputs of the nonlinear operation circuits and applying respective weighting coefficients to the higher order signals. The input signal will have an associated frequency bandwidth and one or more of the higher order signals will fall within the bandwidth of the input signal. The weighting coefficients apply a selective weighting for the one or more higher order signals within the bandwidth of the input signal. The combiner circuit preferably is a complex multiplication circuit and the predistortion output signal output from the combiner circuit is a third order signal derived from the input signal and the higher order signals from the nonlinear operation circuits. The digital predistortion circuit may further comprise a plurality of complex addition circuits receiving and adding the higher order signals from the plurality of nonlinear operation circuits and providing the combined higher order signals to the combiner circuit in the first signal path. The filter bank may comprise first and second filters having a first fixed frequency response and a second fixed frequency response, respectively, the second frequency response comprising the image of the first frequency response. The plurality of nonlinear operation circuits may comprise first, second and third nonlinear operation circuits. The first nonlinear operation circuit comprises a first complex conjugation circuit receiving the output of the second filter and a first complex multiplication circuit receiving the output of the first complex conjugation circuit and the output of the first filter and providing a first higher order signal. The second nonlinear operation circuit comprises first and second magnitude squared circuits receiving the outputs of the first and second filter, respectively, and an addition circuit adding the outputs of the first and second magnitude squared circuits and providing the output as a second higher order signal. The third nonlinear operation circuit comprises a second complex conjugation circuit receiving the output of the first filter and a second complex multiplication circuit multiplying the output of the second complex conjugation circuit and the output of the second filter to provide a third higher order signal.

According to another aspect the present invention provides a digital predistortion circuit adapted to receive a digital input signal and output a digital predistortion signal compensating for memory effects due to plural samples of the input signal. The digital predistortion circuit comprises an input for receiving the digital input signal. The digital predistortion circuit further comprises a first signal path comprising a delay circuit coupled to the input and a combiner circuit coupled to the output of the delay circuit. The digital predistortion circuit further comprises a nonlinear operation circuit coupled to the input and configured in parallel with the first signal path and receiving the digital input signal, the nonlinear operation circuit creating a higher order signal from the digital input signal. A filter bank is coupled to the nonlinear operation circuit and receives the higher order signal, the filter bank comprising plural filters having different frequency responses and outputting plural band limited higher order signals derived from plural samples of the higher order signal. The outputs of the filters are provided to the combiner circuit in the first signal path and combined with the delayed input signal output from the delay circuit in the first signal path to provide a digital predistortion output signal.

In a preferred embodiment of the digital predistortion circuit the input signal is a complex signal and the nonlinear operation circuit comprises a magnitude squared circuit providing a signal corresponding to the magnitude squared of the complex digital input signal. The digital predistortion circuit may further comprise a plurality of weighting circuits coupled to the outputs of the plurality of filters and applying respective weighting coefficients to the band limited higher order signals. The input signal will have an associated frequency bandwidth, and one or more of the band limited higher order signals fall within the bandwidth of the input signal. The weighting coefficients apply a selective weighting for the one or more higher order signals within the bandwidth of the input signal. The combiner circuit is preferably a complex multiplication circuit and the predistortion output signal output from the combiner circuit is a third order signal derived from the input signal and the band limited higher order signals. The digital predistortion circuit may also further comprise a plurality of complex addition circuits receiving and adding the band limited higher order signals and providing the combined band limited higher order signals to the combiner circuit in the first signal path. The filter bank may comprise first and second filters having a first fixed frequency response and a second fixed frequency response, respectively, the second frequency response comprising the image of the first frequency response, and a third filter having a different frequency response than said first and second filters.

According to another aspect the present invention provides a digital predistortion circuit adapted to receive a digital input signal and output a digital predistortion signal compensating for memory effects due to plural samples of the input signal. The digital predistortion circuit comprises an input for receiving the digital input signal. The digital predistortion circuit further comprises a filter bank comprising at least two filters having different frequency responses and outputting at least first and second band limited signals derived from plural samples of the digital input signal. The digital predistortion circuit further comprises a plurality of nonlinear operation circuits coupled to the filter bank and receiving the band limited signals, the nonlinear operation circuits creating third order or higher order signals from the band limited signals, and one or more combiner circuits receiving and combining the outputs of the nonlinear operation circuits to provide a digital predistortion output signal.

In a preferred embodiment the digital predistortion circuit may further comprise a plurality of weighting circuits coupled to the outputs of the nonlinear operation circuits and applying respective weighting coefficients to the higher order signals. The input signal will have an associated frequency bandwidth and one or more of the higher order signals fall within the bandwidth of the input signal. The weighting coefficients apply a selective weighting for the one or more higher order signals within the bandwidth of the input signal. The one or more combiner circuits preferably comprise a plurality of complex addition circuits. The filter bank may comprise first and second filters having a first fixed frequency response and a second fixed frequency response, respectively, the second frequency response comprising the image of the first frequency response. The plurality of nonlinear operation circuits may comprise first, second, third and fourth nonlinear operation circuits. The first nonlinear operation circuit comprises a first complex squaring circuit receiving the output of the first filter, a first conjugation circuit receiving the output of the second filter, and a first complex multiplication circuit receiving the output of the complex squaring circuit and the first complex conjugation circuit and providing a first higher order signal. The second nonlinear operation circuit comprises first and second magnitude squared circuits receiving the outputs of the first and second filter, respectively, an addition circuit adding the outputs of the first and second magnitude squared circuits, and a second complex multiplication circuit multiplying the output of the first filter and the output of the addition circuit and providing the output as a second higher order signal. The third nonlinear operation circuit comprises a third complex multiplication circuit receiving and multiplying the output of the second filter and the output of the addition circuit and providing the output as a third higher order signal. The fourth nonlinear operation circuit comprises a second complex conjugation circuit receiving the output of the first filter, a second complex squaring circuit receiving the output of the second filter, and a fourth complex multiplication circuit multiplying the output of the second complex conjugation circuit and the output of the second complex squaring circuit to provide a fourth higher order signal.

According to another aspect the present invention provides a digital predistortion circuit adapted to receive a digital input signal and output a digital predistortion signal compensating for memory effects due to plural samples of the input signal. The digital predistortion circuit comprises an input for receiving the digital input signal. The digital predistortion circuit further comprises a nonlinear operation circuit coupled to the input and receiving the digital input signal. The digital predistortion circuit further comprises a nonlinear operation circuit creating third or higher order signals from the digital input signal. A filter bank is coupled to the nonlinear operation circuit and receives the third or higher order signals, the filter bank comprising plural filters having different frequency responses and outputting plural band limited third order or higher order signals derived from plural samples of the third or higher order signal. The digital predistortion circuit further comprises one or more combiner circuits receiving and combining the outputs of the filters to provide a predistortion output signal.

In a preferred embodiment of the digital predistortion circuit the input signal is a complex signal and the nonlinear operation circuit comprises a circuit providing a third order signal corresponding to the magnitude squared of the complex digital input signal multiplied by the complex digital input signal. The digital predistortion circuit may further comprise a plurality of weighting circuits coupled to the outputs of the plurality of filters and applying respective weighting coefficients to the band limited third order or higher order signals. The input signal will have an associated frequency bandwidth, and one or more of the band limited third order or higher order signals fall at least partially within the bandwidth of the input signal. The weighting coefficients apply a selective weighting for the one or more third order or higher order signals within the bandwidth of the input signal. The one or more combiner circuits preferably comprise a plurality of complex addition circuits receiving and adding the band limited third order or higher order signals. The filter bank may comprise first, second, third and fourth filters each having a different fixed frequency response.

According to another aspect the present invention provides an adaptive digital predistortion system adapted to receive a digital input signal and output a predistorted digital signal to a nonlinear component and to receive a digital sample of the output of the nonlinear component. The digital predistortion system comprises an input coupled to receive the digital input signal. A digital predistorter module is coupled to the input and comprises a predistortion circuit operating on the digital input signal to create band limited signals from the input signal and employing separate predistortion coefficients for weighting the band limited signals. The digital predistortion system further comprises an error generator circuit for receiving the digital input signal and the digital sample of the output of the nonlinear component and providing a digital error signal. The digital predistortion system further comprises an adaptive coefficient generator, coupled to receive the digital input signal, and the digital error signal and comprising a spectral weighting circuit to derive separately weighted frequency components from the input signal and error signal and a coefficient estimator circuit for calculating updated predistortion coefficients weighted differently for different frequency components and providing the updated predistortion coefficients to the digital predistorter module.

In a preferred embodiment of the adaptive digital predistortion system the coefficient estimator circuit comprises a weighted least mean square coefficient estimator. The coefficient estimator circuit preferably comprises a digital signal processor programmed with a weighted least mean square algorithm. The spectral weighting circuit preferably comprises a plurality of digital filters receiving and operating on the digital input signal and the digital error signal. The spectral weighting circuit preferably further comprises a subsequence calculation circuit for deriving frequency limited subsequences from the digital input signal and one of the plurality of digital filters receives and operates on the digital error signal and the remaining ones of the plurality of digital filters receive and operate on the frequency limited subsequences.

According to another aspect the present invention provides a linearized amplifier system adapted to receive a digital input signal and output an amplified RF signal. The linearized amplifier system comprises an input coupled to receive the digital input signal. The linearized amplifier system further comprises a digital predistorter module. The digital predistorter module comprises a first signal path coupled to the input, the first signal path comprising a delay circuit and a combiner circuit coupled to the output of the delay circuit. The digital predistorter module further comprises a second signal path, coupled to the input in parallel with the first signal path, comprising a first digital predistorter circuit providing a memoryless predistortion operation on the input signal operating on single samples of the input signal. The digital predistorter module further comprises a third signal path, coupled to the input in parallel with the first and second signal paths, comprising a second digital predistorter circuit providing a memory based predistortion operation on the input signal employing plural samples of the input signal. The combiner circuit of the digital predistorter module receives and combines the outputs of the first and second digital predistorter circuits with the output of the delay circuit of the first signal path to provide a predistorted digital signal. The linearized amplifier system further comprises a digital to analog converter coupled to receive the predistorted digital signal from the digital predistorter module and provide a predistorted analog signal and an up converter receiving the predistorted analog signal from the digital to analog converter and converting it to an RF analog signal. The linearized amplifier system further comprises a power amplifier receiving the RF analog signal and providing an amplified RF output signal.

According to another aspect the present invention provides an adaptively linearized amplifier system. The adaptively linearized amplifier system comprises an input coupled to receive a digital input signal. The adaptively linearized amplifier system further comprises a digital predistorter module coupled to the input and receiving the digital input signal and outputting a predistorted digital signal. The digital predistorter module comprises a predistortion circuit operating on the digital input signal to create band limited signals from the input signal and employing separate predistortion coefficients for weighting the band limited signals. The adaptively linearized amplifier system further comprises a digital to analog converter coupled to receive the predistorted digital signal output of the digital predistorter module and provide an analog signal and an up converter for receiving the analog signal from the digital to analog converter and converting it to an RF analog signal. The adaptively linearized amplifier system further comprises a power amplifier receiving the RF analog signal and providing an amplified RF output signal. An output sampling coupler is coupled to sample the analog RF output signal from the power amplifier. The adaptively linearized amplifier system further comprises a feedback circuit path, coupled to the output sampling coupler, comprising a down converter and an analog to digital converter converting the sampled RF output signal to a digital sampled signal representative of the RF output signal. The adaptively linearized amplifier system further comprises an error generator circuit coupled to the input and the feedback circuit path for receiving the digital input signal and the digital sampled signal and providing a digital error signal. The adaptively linearized amplifier system further comprises an adaptive coefficient generator, coupled to receive the digital input signal and the digital error signal, and providing updated predistortion coefficients to the digital predistorter module. The adaptive coefficient generator comprises a spectral weighting circuit to derive separately weighted frequency components from the digital input signal and digital error signal and a coefficient estimator circuit for calculating updated predistortion coefficients weighted differently for different frequency components.

According to another aspect the present invention provides a method for digitally predistorting a digital input signal. The method comprises receiving a digital input signal and splitting the digital input signal along three parallel signal paths. The method further comprises delaying the signal provided along the first signal path. The method further comprises digitally predistorting the signal provided along the second signal path employing a single sample of the input signal to provide a memoryless predistortion correction. The method further comprises digitally predistorting the signal along the third signal path employing plural samples of the input signal to provide a memory based digital predistortion correction. The method further comprises combining the memoryless and memory based digital predistortion corrections provided from the second and third signal paths with the delayed signal in the first signal path to provide a predistorted digital output signal.

According to another aspect the present invention provides a method for digitally predistorting a digital input signal. The method comprises receiving a digital input signal and deriving a plurality of band limited higher order signals from the digital input signal. The method further comprises weighting the plurality of band limited higher order signals with predistortion coefficients varying between the band limited higher order signals to provide a predistortion correction signal. The method further comprises combining the predistortion correction signal with the digital input signal to provide a predistorted digital output signal.

In a preferred embodiment of the method for digitally predistorting a digital input signal deriving a plurality of band limited higher order signals from the digital input signal comprises filtering the input signal to create plural band limited signals and performing plural nonlinear operations on the band limited signals to create the band limited higher order signals. Alternatively, deriving a plurality of band limited higher order signals from the digital input signal preferably comprises performing a nonlinear operation on the input signal to create a higher order signal and performing plural filtering operations on the higher order signal to create said band limited higher order signals. The band limited higher order signals may be second order signals and the method may further comprise multiplying the band limited higher-order signals with the digital input signal to provide a third order digital signal as the predistortion correction signal. Alternatively the band limited higher order signals may be third order signals. The input signal has an associated frequency bandwidth, and one or more of the band limited higher order signals fall within the frequency bandwidth of the input signal. The predistortion coefficients preferably apply a selective weighting for the one or more higher order signals within the frequency bandwidth of the input signal.

According to another aspect the present invention provides a method for digitally predistorting a digital input signal. The method comprises receiving a digital input signal and deriving a plurality of higher order signals representative of nonlinear basis functions based on a joint time frequency representation of plural samples of the digital input signal. The method further comprises weighting the plurality of higher order signals with predistortion coefficients to provide a predistortion correction signal. The method further comprises combining the predistortion correction signal with the digital input signal to provide a predistorted digital signal.

In a preferred embodiment of the method for digitally predistorting a digital input signal the nonlinear basis functions comprise truncated Gaussian functions based on a Gabor expansion of the input signal.

According to another aspect the present invention provides a method for adaptive digital predistortion linearization of an amplifier system. The method comprises receiving a digital input signal and deriving a plurality of band limited higher order signals from the digital input signal. The method further comprises weighting the plurality of band limited higher order signals with spectrally weighted predistortion coefficients to provide a predistortion correction signal, and combining the predistortion correction signal with the digital input signal to provide a predistorted digital signal. The method further comprises converting the predistorted digital signal from digital to analog form to provide a predistorted analog signal and up converting the predistorted analog signal to an RF signal. The method further comprises amplifying the RF signal to provide an amplified RF output signal. The method further comprises sampling the RF output signal and down converting the sampled RF output signal to a lower frequency sampled analog output signal. The method further comprises converting the lower frequency sampled analog output signal to digital form to provide a sampled digital output signal. An error signal is derived from the input digital signal and the sampled digital output signal. The method further comprises deriving spectrally weighted subsignals from the error signal and the digital input signal and adaptively generating said spectrally weighted predistortion coefficients from the spectrally weighted subsignals.

Further features and advantages are described in the following detailed description of the invention.

DETAILED DESCRIPTION

Figure 1:
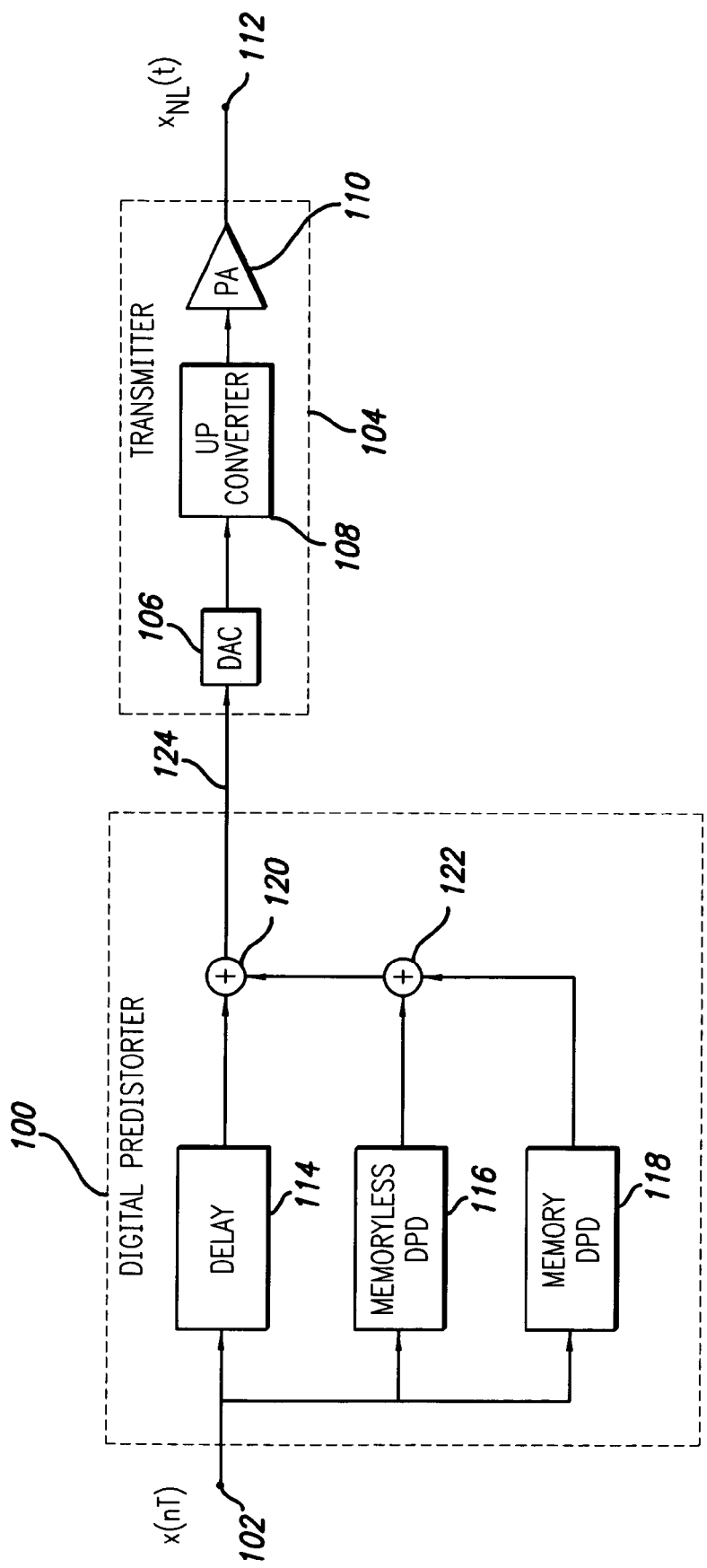
FIG. 1 is a block schematic drawing of a linearized power amplifier system employing digital predistortion linearization in accordance with a preferred embodiment of the present invention.

A preferred embodiment of a linearized power amplifier system employing digital predistortion linearization in accordance with the present invention is generally shown in FIG. 1. As indicated, the power amplifier system may preferably be part of a communication system including a transmitter, such as a cellular wireless communication system.

As shown in FIG. 1 a digital input signal is applied at the input 102 and provided to digital predistorter 100. The digital input signal may typically be provided in complex form having an in phase (I) and quadrature (Q) component, as is well known in the art, and such is implied herein although single signal lines are shown for ease of illustration. For example, the input signal may be any of a number of known wide bandwidth signals, such as CDMA and WCDMA signals, employed in cellular wireless communications systems. The digital predistorter 100 implements a predistortion operation on the input signal to compensate for nonlinearities introduced by the power amplifier 110 in transmitter 104. In addition to the power amplifier 110 the transmitter 104 may include conventional digital to analog converter (DAC) stage 106 and up converter stage 108 and optionally additional conventional components employed in wireless communications applications. The predistortion operation implemented by digital predistorter 100 may also optionally correct any nonlinearities provided by such other components of the transmitter 104. The amplified analog signal is provided at output 112, typically to a conventional antenna system in a cellular wireless communications application (not shown).

As shown in FIG. 1, the digital predistorter 100 includes three parallel signal paths 114, 116 and 118. The first signal path 114 provides a simple delay to the input digital signal, i.e., without any predistortion applied to the signal. This delay is provided to equal the delays inherent in the second and third signal paths 116 and 118 so that the signals from the three paths can be synchronized when combined at combining circuitry 120. The second two paths, 116 and 118 correspond to memoryless digital predistortion (DPD) and memory digital predistortion (DPD) circuit blocks, respectively. The memoryless and memory digital predistortion operations are implemented in separate signal paths to allow each predistortion operation to be maximized for both efficiency and effectiveness in compensating for the different sources of nonlinearity. As will be discussed below in detail, the memory DPD circuit block is preferably based on a polynomial model of the nonlinearity. However, the memoryless DPD circuit block may be implemented differently, for example, using a look-up table (LUT) that maps PA gain corrections to the input power (or magnitude). Also, the memoryless DPD circuit block 116 will operate on single samples of the input signal to generate individual digital predistortion corrections while the memory DPD block 118 operates on plural samples of the input signal as described in detail below. Separating the memoryless and memory DPD operations thus allows the use of different structures or different orders of correction. The memory DPD circuit block has the potential to correct part of the memoryless distortion, which would reduce the burden on the memoryless DPD (and vice versa). However, due to this interaction, the adaptation of the two DPD circuit blocks should preferably not be concurrent (an adaptive embodiment of the present invention is described in detail below in relation to FIG. 7). The two predistortion corrections provided by memoryless DPD circuit block 116 and memory DPD circuit block 118 are combined at combining circuit 122, which may be a complex addition circuit, to form a combined predistortion correction to the input signal. This combined predistortion correction signal is then applied to the input signal at main path combining circuit 120, which may also be a complex addition circuit, to provide a predistorted digital signal. This predistorted digital signal is provided along line 124 to the digital input of transmitter circuitry 104. The subsequent operation of transmitter circuitry 104, and especially the nonlinear operation of amplifier 110, on the digital predistorted input signal introduces offsetting memory based and memoryless distortion resulting in a substantially linear analog output signal at system output 112.

The memoryless DPD circuit block 116 may be implemented using various techniques including a LUT based circuit block, as noted above. For example, a LUT based DPD implementation suitable for circuit block 116 is disclosed in U.S. patent application Ser. No. 10/818,547 filed Apr. 5, 2004, the disclosure of which is incorporated herein by reference in its entirety. More generally, memoryless DPD circuit block 116 may be implemented using conventional DPD circuits and still provide acceptable memoryless distortion correction due to the more tractable nature of such distortion. Such known memoryless DPD circuit implementations for DPD circuit block 116 will not be described in more detail since a variety of different known implementations may be employed as will be appreciated by those skilled in the art.

Next the preferred embodiments of memory DPD circuit block 118 will be described. The preferred methods of correcting power amplifier memory effects implemented by memory DPD circuit block 118 involve altering a memoryless model based on a Taylor series expansion. Two embodiments are illustrated in detail that model and correct the frequency dependent behavior associated with the memory of the power amplifier. The first embodiment (described in detail below in relation to FIGS. 5 and 6) transforms even-order nonlinear sub-signals into a joint time-frequency representation. The transformed even-order sub-signals are then used to re-modulate the input signal, producing the desired odd-order correction. The first embodiment has the benefit of achieving the memory correction using a low number of coefficients. The second embodiment (described in detail below in relation to FIGS. 11 and 12) transforms odd-order nonlinear sub-signals into a joint time-frequency representation, increasing the number of coefficients available for tuning.

First the general principles of operation generally underlying both embodiments of memory DPD circuit block 118 will be described. A time-frequency representation based on time-shifted and frequency-modulated Gaussian functions, referred to as a Gabor expansion, is used to illustrate the theory of operation. (See, D. Gabor, "Theory of communication," *J. IEE*, vol. 93, pp. 429–459, 1946, the disclosure of which is incorporated herein by reference.) The approaches described herein can use any type of time-frequency representation, formed by time-shifting and frequency-modulating other types of window functions (for example, Hanning or raised cosine windows). In the preferred embodiments, the input signal is not transformed or sub-divided in any manner; the time-frequency expansions are applied only to the nonlinear modes derived from the input signal that generate the correction signal, $x_{DPD}(nT)$.

A RF signal, $x_{NL}(t)$, at the output of a memoryless nonlinear device such as amplifier 110 can be modeled by an odd-order Taylor series:

$$x_{NL}(t) = \sum_{k=0}^{m} a_{2k+1} \bullet |x(t)|^{2k} \bullet x(t) \qquad \text{(Eq. 1)}$$

where $a_k$ are complex coefficients and $x(t)$ is the RF input signal. The memoryless model within (Eq. 1) assumes the nonlinear modes are functions of the instantaneous input value, $x(t)$, only. In contrast, for a power amplifier exhibiting memory effects, the nonlinear modes are functions of both instantaneous and past input values. However, when the input signal is bandlimited, the basis functions used to model either $|x(t)|^{2k}$ or $|x(t)|^{2k} x(t)$ can be modified to compensate for the effects of power amplifier memory. An input signal, $x(t)$, derived from a time-sampled sequence, $x(nT_h)$, is bandlimited: that is, $$x(t) = \sum_{n} x(nT_h) \bullet h(t - nT_h) \qquad \text{(Eq. 2)}$$

where $h(t)$ is a bandlimited interpolation function and $T_h$ is the sampling interval.

Figure 2A:
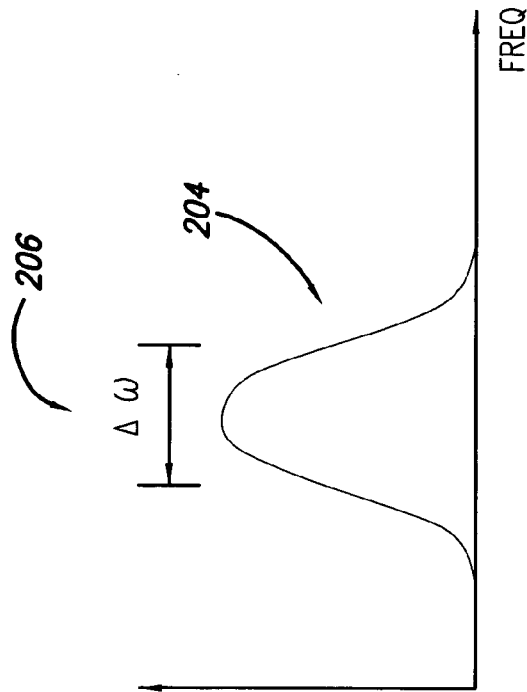
FIGS. 2A, 2B and 2C are graphical representations of time-shifted and frequency-modulated Gaussian functions in the time domain, frequency domain and joint time and frequency domain, respectively.
Figure 2B:
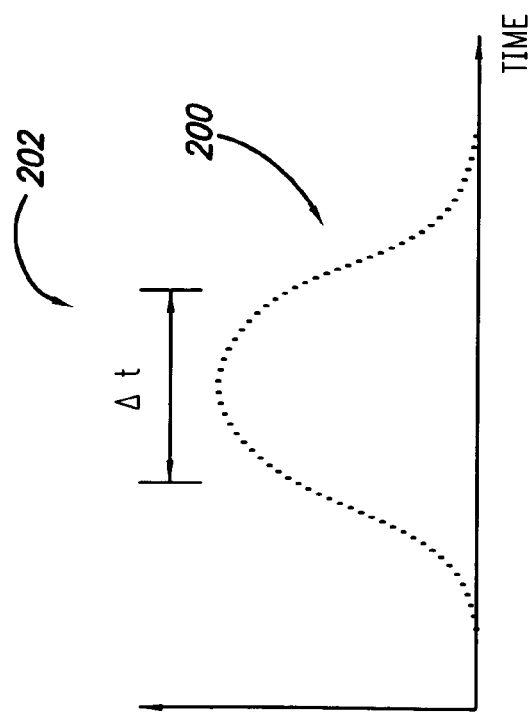
Figure 2C:
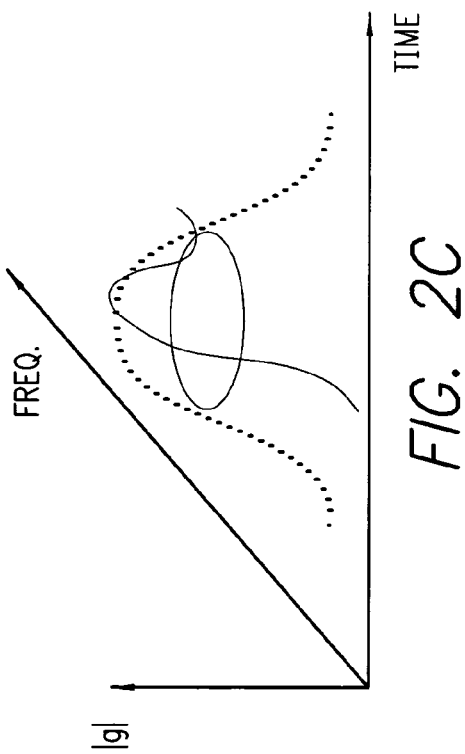

It is possible to create a joint time-frequency sampled representation of the input signal, referred to as a Gabor expansion, using a weighted sum of time-shifted and frequency-modulated Gaussian functions. (See D. Gabor, "Theory of communication," as referenced above.) The Gaussian function, denoted by $g(t)$, is $$g(t) = \exp(-\alpha \cdot t^2) \qquad \text{(Eq. 3)}$$

where $\alpha$ is a positive constant. It has a Gaussian shape in both the time and frequency domains as shown in FIGS. 2A–2C. FIGS. 2A and 2B show the time-shifted and frequency-modulated Gaussian function in the time and frequency domains, respectively, and FIG. 2C illustrates the combined time and frequency domain representation. It should be noted that the temporal standard deviation 202 of the time domain Gaussian function 200 (FIG. 2A) and the frequency standard deviation 206 of the Gaussian function 204 (FIG. 2B), cannot be chosen independently (that is, $\Delta t \Delta \omega$=constant). (See D. Gabor, "Theory of communication," as referenced above).

Figure 3B:
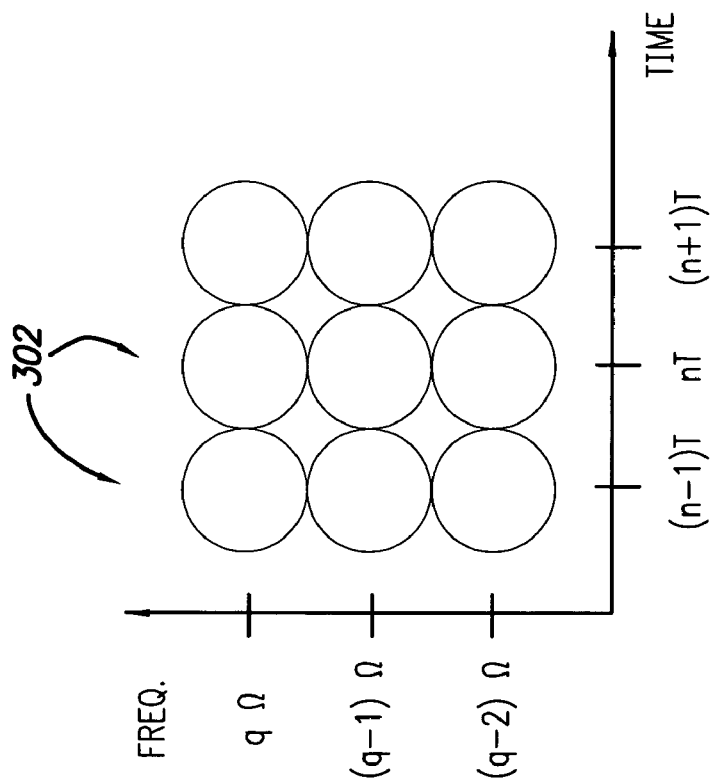
FIGS. 3A and 3B are graphical representations of sampling locations for a time series representation and a joint time-frequency representation of a digital signal, respectively.
Figure 3A:
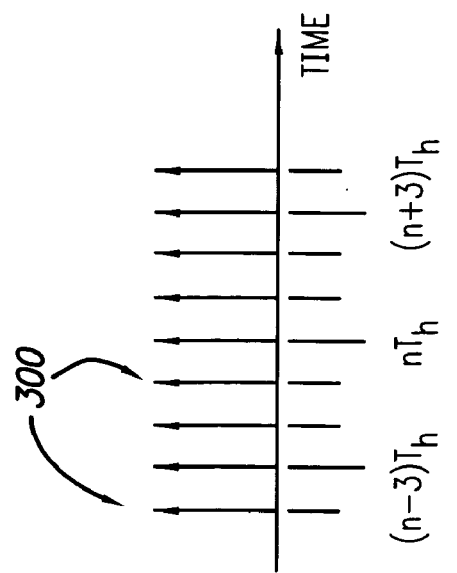

The Gabor expansion is $$x(t) = \sum_{q} \sum_{n} y_q(nT) \bullet g(t - nT) \bullet \exp(jq \bullet \Omega \bullet t) \qquad \text{(Eq. 4)}$$

where q is an integer; T and $\Omega$ are the sample intervals within the time and frequency domains, respectively. This joint time-frequency sampled representation partitions the spectrum of the input sequence into $N_q$ overlapping frequency bands. The samples for the time series in (Eq. 2) and the Gabor expansion in (Eq. 4) are shown in FIG. 3A–3B. FIG. 3A illustrates sampling locations 300 for a time series and FIG. 3B illustrates sampling locations 302 for a joint time-frequency representation. It should be appreciated that the temporal sampling interval in the Gabor expansion, T, is not the same as the original sampling interval, $T_h$. To preserve the number of independent samples, the former should be longer by a factor equal to the number of frequency samples (that is, $T=T_h*N_q$). As a convention, the temporal and frequency sampling intervals are 1.4 times the respective standard deviations of the Gaussian envelope. As a consequence, the temporal sampling interval and temporal width of the Gaussian both increase with the number of frequency samples. This is significant because the quality of the DPD correction is determined by the temporal width of the Gaussian relative to the delay introduced by the memory effect (see later (Eq. 13)).

The samples of the Gabor expansion, $y_q(nT)$, are obtained using a known transformation from the input sequence $x(nT_h)$. The transformation accounts for overlaps in the time-shifted, frequency-modulated Gaussians, as well as the original interpolation function, $h(t)$.

Replacing the Gaussian function with an alternative window creates similar types of joint time-frequency expansions. The Gaussian, which makes the mathematics more tractable, is shown for illustrative purposes. In practice, the Gaussian function is not used because it has an infinite extent in the time domain (approaches zero asymptotically). A Hanning window or a raised cosine window can be used instead to build the time-frequency representation with similar success.

In addition, the joint time-frequency representation can be achieved using a bank of filters instead of an expansion. Although the filter bank does not explicitly account for overlaps between non-orthogonal kernels, the effect is similar to changing the window function. That is, a filter bank of Gaussians functions, $g(t)$, is the same as an expansion using a bi-orthogonal function, $g_b(t)$. (See, M. J. Bastiaans, "Gabor's expansion of a signal into Gaussian elementary signals," Proc. IEEE, vol. 68, pp. 538–539, 1980, and M. J. Bastiaans, "A sampling theory for the complex spectrogram, and Gabor's expansion of a signal in Gaussian elementary signals," Optical Eng., vol. 20, no. 4, pp. 594–598, 1981, the disclosures of which are incorporated herein by reference). The bi-orthogonal relationship between g(t) and $g_b$(t) is defined by $$\int g(t-kT) \cdot g_b(t-mT) dt = 1 \text{ when } k=m \quad \text{(Eq. 5)}$$

$$\int g(t-kT) \cdot g_b(t-mT) dt = 0 \text{ when } k \neq m. \quad \text{(Eq. 6)}$$

In summary, the filter bank and the joint time-frequency expansion are equally suitable representations for memory compensation.

After the above general discussion of the underlying theory of operation, next the principles of operation of the first embodiment of the memory DPD circuit block 118 of the present invention will be described.

A third-order nonlinearity may be written using (Eq. 4) to represent the $|x|^2$ term:

$$x(t) \bullet |x(t)|^2 = x(t) \bullet \sum_L \sum_k z_L\left(\frac{kT}{2}\right) \bullet g^2\left(t - \frac{kT}{2}\right) \bullet \exp(jL \bullet \Omega \bullet t) \quad \text{(Eq. 7)}$$

where $L = q_1 - q_2$, $k = n_1 + n_2$, and $$z_L\left(\frac{kT}{2}\right) = \sum_{n(1)} \sum_{n(2)} [y_{q(1)}(n_1 T) y^*_{q(2)}(n_2 T)] \bullet \exp\left\{-\frac{\alpha \bullet \Delta_n^2 T^2}{2}\right\} \quad \text{(Eq. 8)}$$

$$g^2(t) = [g(t)]^2 \quad \text{(Eq. 9)}$$

$$\Delta_n^2 = (n_1 - n_2)^2. \quad \text{(Eq. 10)}$$

From (Eq. 7), it can be seen that the power envelope comprises a weighted sum of frequency-offset basis functions:

$$\beta_2(kT, L\Omega) = g^2\left(t - \frac{kT}{2}\right) \bullet \exp(jL \bullet \Omega \bullet t). \quad \text{(Eq. 11)}$$

Compensation of memory effects is achieved by re-shaping the basis functions used within the nonlinear mode models. The simplest modification is to delay the Gaussian window $g^2$ by an offset, $\delta\tau$.

Figure 4:
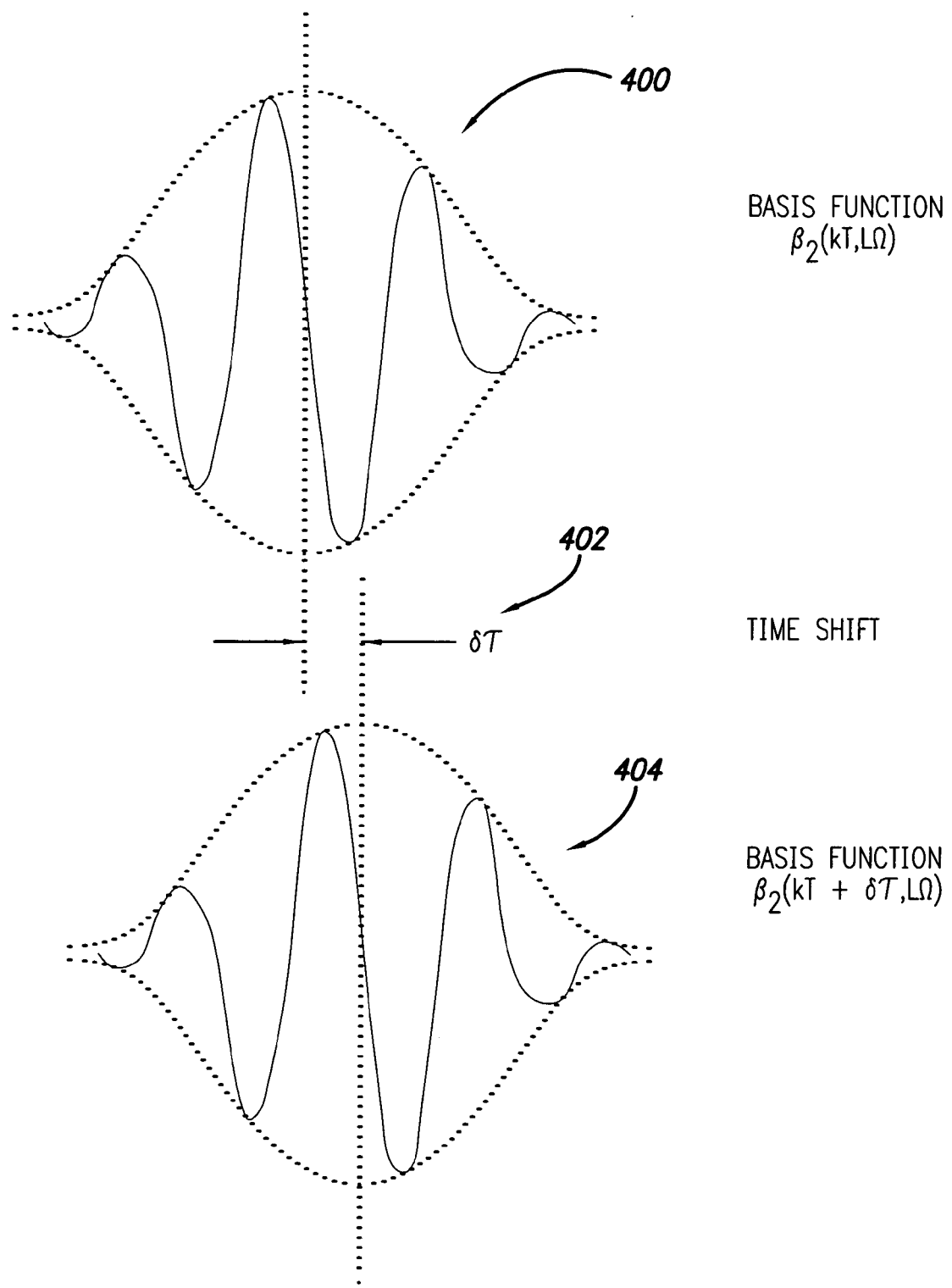
FIG. 4 is a graphical representations of a basis function and the effect of a time delay on the basis function.

The effect of a time shift, $\delta\tau$, on the basis function $\beta_2$(kT,L$\Omega$) is shown in FIG. 4. In FIG. 4 the original basis function is illustrated at 400 and, after a small time shift 402, the shifted basis function is illustrated at 404. For small delays, the change in the basis function is approximated by a phase shift: that is, $$\beta_2(kT+\delta\tau, L\Omega) \approx \beta_2(kT, L\Omega) \cdot \exp(jL \cdot \Omega \cdot \delta\tau). \quad \text{(Eq. 12)}$$

The quality of the memory compensation is determined by the correlation between $\beta_2$(kT,L$\Omega$) and $\beta_2$(kT+$\delta\tau$,L$\Omega$), which is dependent largely on the width of the Gaussian and the size of the delay. The correlation, $\rho$, should be close to unity for good memory compensation: that is, $$\rho = g^4(\delta\tau) \approx 1. \quad \text{(Eq. 13)}$$

The phase offset term, L$\Omega\delta\tau$, can be incorporated into the coefficients of the Taylor series model: from (Eq. 1), (Eq. 7), (Eq. 11) and (Eq. 12), we get $$x_{NL}(t) = x(t) + x(t) \bullet \sum_L c_{2,L} \sum_k z_L\left(\frac{kT}{2}\right) \bullet \beta_2(kT, L\Omega) \quad \text{(Eq. 14)}$$

where the coefficients $c_{2,L}$ are $$c_{2,L} = a_3 \cdot \exp(jL \cdot \Omega \cdot \delta\tau). \quad \text{(Eq. 15)}$$

A least mean squared (LMS) estimator is preferably used to calculate the coefficients that best correct the power amplifier memory effects.

Figure 5:
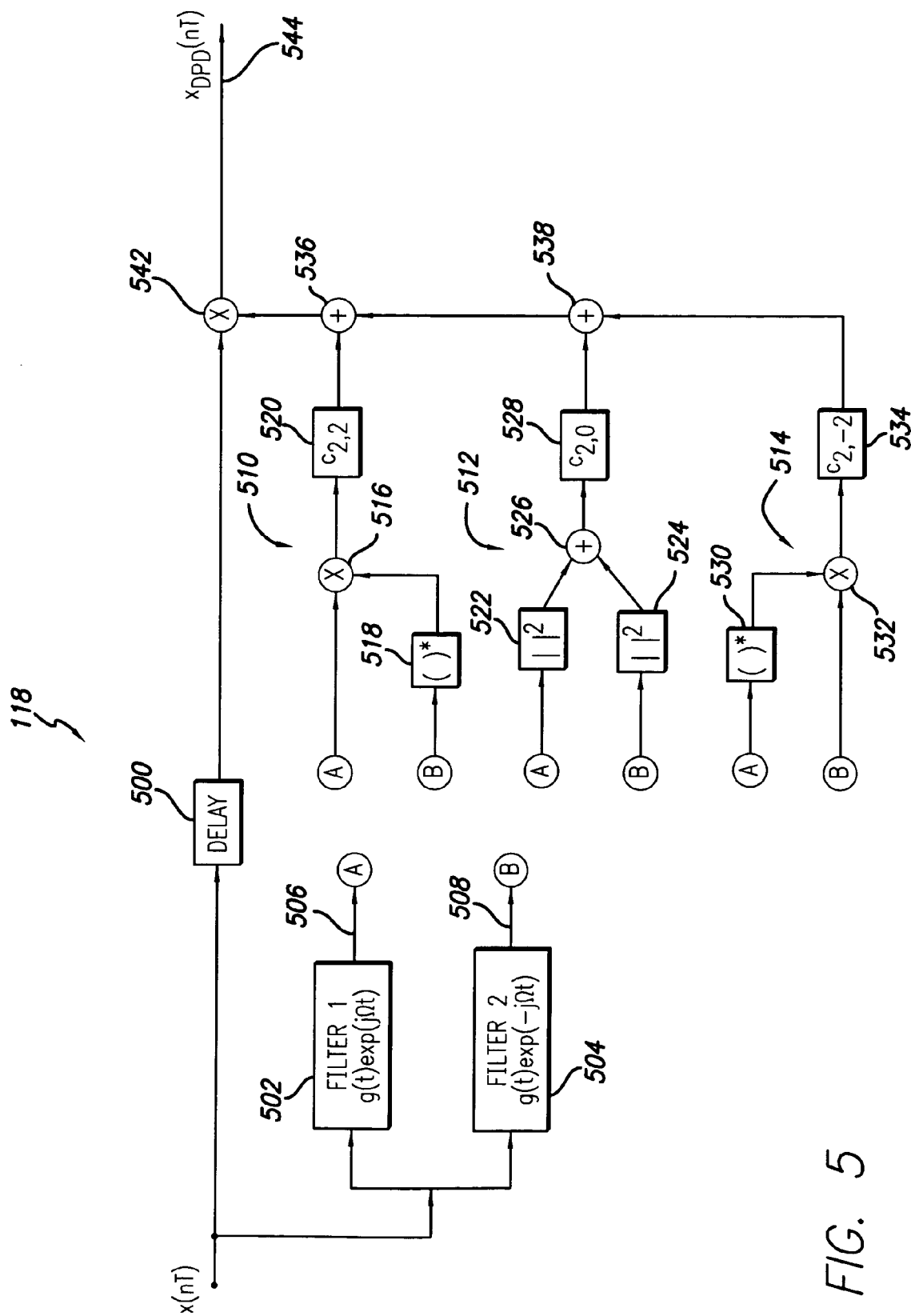
FIG. 5 is a block schematic drawing of a first embodiment of the memory digital predistortion circuit employed in the power amplifier system of FIG. 1.
Figure 6:
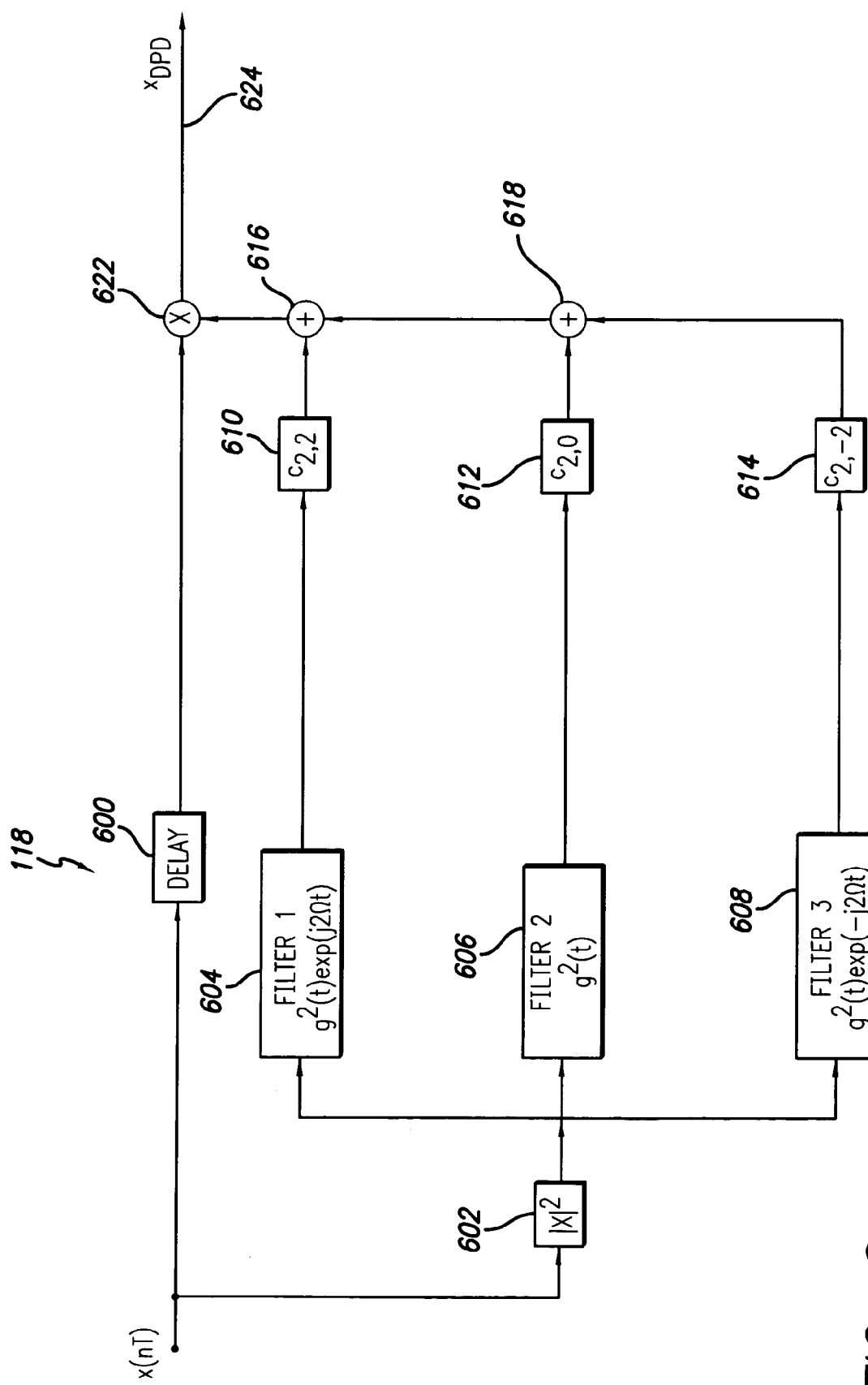
FIG. 6 is a block schematic drawing of an alternate implementation of the first embodiment of the memory digital predistortion circuit employed in the power amplifier system of FIG. 1.

It is possible to implement the third-order correction using (Eq. 7) and (Eq. 8) implemented directly in a suitably programmed DSP or arithmetic operation circuit implementation of circuit block 118. However, in such an implementation the transformation from $x(nT_h)$ to $y_q$(nT) is required which will generally require too much processing power or arithmetic operations to be a practical cost effective embodiment. The preferred implementations of circuit block 118 instead use filter banks to create the joint time-frequency representation, as shown in two separate implementations in FIG. 5 and FIG. 6. In the implementation of FIG. 5, filtering is applied before the nonlinear operation, | |$^2$. In the implementation of FIG. 6, filtering is applied after the nonlinear operation, | |$^2$.

More specifically, referring to FIG. 5 the input signal is provided along a first signal path comprising a delay 500. The input signal is also applied to a second path where it is provided to a filter bank comprising first and second filters 502 and 504 which create the joint time-frequency representation from the input signal, using Gaussian functions g(t) as described above, and split the input signal into two band limited components (denoted A and B) provided along lines 506 and 508. (As used herein, band limited includes high pass or low pass bands as well as strict limiting to a defined band.) The frequency bands passed by filters 506 and 508 will be chosen based on the spectral characteristics of the input signal and the expected nonlinear modes generated by the power amplifier or the spectral mask for the specific cellular application. The filters may therefore have fixed filter coefficients simplifying the implementation of the circuitry. Filters 502 and 504 have different frequency responses and filter 504 is illustrated with a frequency response which is the image of filter 502. The two components A and B are provided to three separate signal paths 510, 512 and 514 comprising respective nonlinear operation circuits which create higher order signals from the band limited signals A and B. In these signal paths auto- and cross-terms are preferably computed producing sub-sequences concentrated in three different parts of the spectrum. More specifically, in signal path 510 the complex conjugate of the signal B is computed at 518 and multiplied with the signal A at complex multiplying circuit 516. In signal path 512, the signals A and B are provided to circuits 522 and 524, respectively, which compute the magnitude squared of the respective signals, which are then added at addition circuit 526. In signal path 514, the input signal A is provided to complex conjugate circuit 530, which is then multiplied with the signal B at complex multiplication circuit 532. By applying complex weights to the sub-sequences, at weighting circuits 520, 528 and 534, the frequency response becomes adjustable, which in turn provides the capability for selectively compensating for memory effects. (The subscripts of the coefficients indicate the order of the nonlinear mode and the frequency response respectively.) The coefficients to the weighting circuits 520, 528, and 534 may be selected (referred to as "selective weighting") so that the corrected output signal has the maximum margin relative to the spectral mask (the amount that the corrected PA output spectrum is below the spectral mask specification), the minimum distortion outside of the bandwidth of the linear signal, or minimum distortion power, and such weighting may be adaptively provided as described herein. For the first two criteria, the cross-term sub-sequences provided on signal paths 510 and 514 tend to be the most important for the purpose of memory correction because the important spectral regrowth occurs outside of the original linear signal bandwidth. The respective weighted subsequences are combined at addition circuit 538 and addition circuit 536. The combined weighted subsequences are then multiplied with the delayed input signal at complex multiplication circuit 542 to create a third order signal and provide the output as the memory digital predistortion correction signal on line 544.

In the embodiment of FIG. 6, the input signal is provided along a first signal path comprising delay circuit 600. The input signal is also provided along a second signal path to nonlinear operation circuit 602, which computes the magnitude squared of the input signal. The magnitude squared signal is then provided to a filter bank comprising first filter 604, second filter 606 and third filter 608. The filters 604, 606 and 608 create the joint time-frequency representation using squared Gaussian functions, in this case after the nonlinearity provided by circuitry 602, to create the desired sub-sequences which are band limited signals. The sub-sequences are then provided to weighting circuits 610, 612 and 614 which weights the subsequences with the appropriate complex weighting coefficients. The weighted subsequences are then provided to complex addition circuit 618 and 616 and then provided to multiplying circuit 622. The delayed input signal is multiplied with the weighted subsequences at complex multiplying circuit 622 to provide the third order digital predistotion correction signal along line 624.

The DPD operations of the two implementations shown in FIG. 5 and FIG. 6 differ because the overlap between the non-orthogonal filters 1 and 2 within FIG. 5 is not accounted for within FIG. 6. However, the outer filters in FIG. 6, which are the most important, are the least affected.

When comparing the post-filtering implementation shown in FIG. 6 with the Gabor expansion, (Eq. 7) and (Eq. 8), it can be seen that $z_L(mT)$ is replaced by $|x(mT)|^2$. As mentioned earlier, a bank of filters is equivalent to an expansion using a bi-orthogonal window (see M. J. Bastiaans, "Gabor's expansion of a signal into Gaussian elementary signals," Proc. IEEE, vol. 68, pp. 538–539, 1980, M. J. Bastiaans, "A sampling theory for the complex spectrogram, and Gabor's expansion of a signal in Gaussian elementary signals," Optical Eng., vol. 20, no. 4, pp. 594–598). In either case, the memory effects are cancelled; however, the filter bank benefits from ease of implementation. Also, it should be appreciated that a number of modifications may be made which may involve trade offs between circuit complexity and effectiveness of the correction. For example, additional filters may be provided in the respective filter banks and additional nonlinear operation circuits may be provided, providing higher than third order signals if desired.

Higher order compensation can be achieved by modifying the memory compensation shown FIG. 5 or FIG. 6. By modulating the output signal of the memory DPD, either 544 or 624, by an even-order mode of the input signal (delayed appropriately) 732, the order of the correction is increased. For example, modulating by $|x|^2$ produces a fifth-order correction. The higher-order compensation would be implemented, typically, as additional paths parallel to the third-order compensation. The estimator in FIG. 8 would be expanded to include higher-order subsequence calculation circuits, in parallel with 800, whose higher-order subsequences are filtered using $h_{estimator}$ and provided to the coefficient estimate 816. The higher-order subsequences can be modifications of the third-order subsequences, where the outputs 802, 804, and 806 are modulated by the delayed even-order mode of the input signal 732.

For the case of the memory compensation shown in FIG. 6, an alternative form of higher-order compensation can be achieved by increasing the order of the nonlinear circuits 602 and 1002. For example, changing the nonlinear circuits 602 and 1002 to $|x|^4$ would provide fifth-order compensation.

Figure 7:
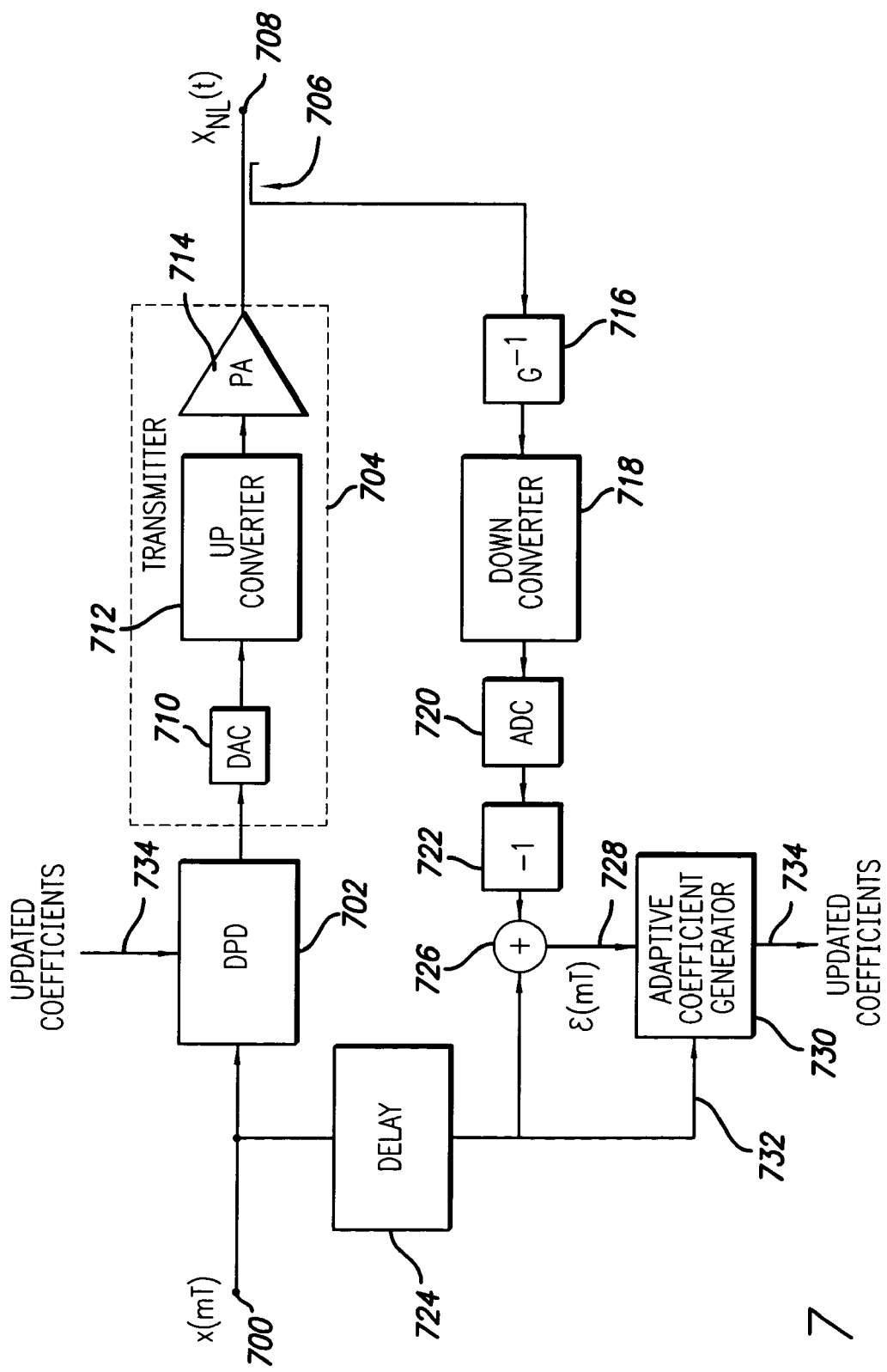
FIG. 7 is a block schematic drawing of a digital predistortion linearized power amplifier system employing adaptive generation of predistortion coefficients in accordance with a preferred embodiment of the present invention.

Referring to FIG. 7 an embodiment of the linearized power amplifier system of the present invention implying adaptive generation of digital predistotion coefficients is illustrated. In the previous embodiment of FIG. 1 the predistortion coefficients may be modeled in advance for the specific application. In the illustrated embodiment of FIG. 7 the predistortion coefficients may be adaptively calculated using the above described theory and the digital predistortion coefficients may be computed as the system operates to minimize error and maximize the linearity of the overall system.

More specifically, as shown in FIG. 7 an input signal is provided at input 700 which as in the previously described embodiment is preferably a complex digital signal having in phase and quadrature components. The signal is provided to digital predistorter 702 which predistorts the input signal to compensate for nonlinearity introduced by the transmitter 704. The implementation of digital predistorter 702 may correspond to circuit 100 described above with however the predistortion coefficients being adaptively generated as described below. The predistorted output of the digital predistorter 702 is provided to transmitter 704 which may comprise conventional circuitry including digital to analog converter 710, up converter 712 and power amplifier 714. As in the previously described embodiment the digital predistorter 702 may compensate for nonlinearity of the power amplifier 714 and optionally nonlinearity introduced by other nonlinear circuitry in transmitter 704. The output of the power amplifier 714 is provided as a generally nonlinear RF output signal in analog form at output 708. This output signal is also sampled by sampling coupler 706 which provides an analog sampled output signal to a feedback (or observation) path used to adaptively generate digital predistotion coefficients. More specifically, the sampled analog output from sampling coupler 706 is first provided to a gain adjusting circuit 716 which provides a suitable adjustment to the sampled signal to normalize the signal for appropriate processing by subsequent circuitry as described below. The gain adjusted sampled analog RF output signal is then provided to down converter 718 which converts the sampled RF output signal to a suitable intermediate or baseband frequency for subsequent processing. The down converted signal is then provided to analog to digital converter (ADC) 720 which samples the analog signal to convert the frequency down converted analog signal to digital form. The output of analog to digital converter 720 thus comprises a digital sampled version of the output signal 708 in the same format as the input signal, i.e. preferably a complex in phase and quadrature digital signal. (As linear operations, the order in which the normalization, down-conversion, and sampling is applied can be changed, or distributed over stages.) This digital sampled output signal is provided to inverter 722 and then to complex addition circuit 726 to collectively implement a subtraction operation. Complex addition circuit 726 also receives a delayed version of the digital input signal provided by delay circuit 724 to compensate for the delay introduced by the DPD 734, transmitter 704, and feedback circuitry 706, 716, 718, 720 and 722 so that the delayed input signal (or sequence of signals) from circuit 724 corresponds to the same signal presented at the output of circuit 722. The output of the complex addition circuit 726 represents an error signal between the input and output signals due to the nonlinearity of power amplifier 714. This error signal is provided along line 728 to adaptive coefficient generator circuit 730. The circuit 730 also receives a copy of the delayed input signal along line 732 and using the error signal and input signal generates new digital predistotion coefficients which are then provided to digital predistorter 702 along line 734. This allows the system to adapt to changing conditions and create new predistotion coefficients adapted for the current operating conditions of the system. This may preferably be done on a batch processing basis and the adaptive coefficient generator 730 may implement the desired adaptive processing using a suitably programmed digital signal processor or other processor.

Adaptive coefficient generator 730 preferably provides updated digital predistotion coefficients for both the memoryless and memory based digital predistortion circuitry (116 and 118, shown in FIG. 1). The adaptive updating of the memoryless coefficients will correspond to the specific memoryless digital predistortion implementation. For example, in a look up table approach the adaptive coefficient generator 730 will generate suitable updated look up table coefficients from the error signal to minimize the error and hence minimize the distortion in the output signal. A specific implementation of such an adaptive look up table system is described in the above mentioned U.S. patent application Ser. No. 10/818,547 filed Apr. 5, 2004, the disclosure of which is incorporated herein by reference in its entirety. Accordingly, the details of such an adaptive look up table coefficient generator for adaptive updating of the memoryless coefficients will not be described in more detail herein. Specific implementations of adaptive coefficient generator 730 for memory DPD coefficients will be described below in relation to FIGS. 8 and 13.

Before describing detailed implementations of adaptive coefficient generator 730 for memory coefficient generation, the basic theory employed will be described. The generation of updated coefficients for the memory digital predistortion circuitry may incorporate the previously described theory of operation in the circuitry 730 to update the coefficients. More specifically, using the model of (Eq. 14) gives the adaptive coefficient generator 730 the ability to compensate (partially) for memory effects without modeling them explicitly. Thus, significant correction of memory effects can be provided when the temporal width of $g^2$ is large enough to keep p near unity (see (Eq. 13)). Larger temporal widths of $g^2$ may be achieved by increasing the number of frequency bands $N_q$ used in the Gabor expansion or filter bank.

The coefficients may be computed using a weighted least mean square (LMS) estimation. The sampled error signal provided along line 728 is determined as follows:

$$\epsilon(mT) = x_{NL}(mT) - x(mT) \qquad \text{(Eq. 16)}$$

where as described above the output signal $x_{NL}(mT)$ has been normalized, down-converted, and sampled by the illustrated feedback circuitry shown in FIG. 7, and input signal $x(mT)$ has been delayed such that the two sequences have the same nominal gain, phase, and alignment in time. The error sequence, $\epsilon(mT)$, has the same sampling rate as the forward path sequence (assumed to be oversampled by at least a factor of 3, see discussion below). The third-order sub-sequences, derived from the input signal, are $$\gamma(mT, L\Omega) = x(mT) \cdot z_L(mT) \cdot \beta_2(mT, L\Omega). \qquad \text{(Eq. 17)}$$

The power amplifier model, referenced to the digital portion of the system, is written as $$\varepsilon(mT) = \sum_L c_{2,L} \bullet \gamma(m, T, L\Omega). \qquad \text{(Eq. 18)}$$

A direct LMS estimation for the three-coefficient case of (Eq. 18) is described below. Measurements are accumulated over a time interval $[mT-m_oT, mT]$. Assuming that the memory DPD has partially corrected the memory effect, the error in the coefficients, denoted by $\Delta c_{2L}$, are computed using $$\Delta c_{2,L} = [\gamma_v \cdot \gamma_v^T]^{-1} \cdot \gamma_v \cdot \epsilon_v \qquad \text{(Eq. 19)}$$

where $\epsilon_v [\epsilon(mT-m_oT) \ldots \epsilon(mT)]^T$, and $$\gamma_v = \begin{bmatrix} \gamma(mT-m_oT, -2\Omega) & \cdots & \gamma(mT, -2\Omega) \\ \gamma(mT-m_oT, 0) & \cdots & \gamma(mT, 0) \\ \gamma(mT-m_0T, 2\Omega) & \cdots & \gamma(mT, 2\Omega) \end{bmatrix}. \qquad \text{(Eq. 20)}$$

The coefficients are updated in an iterative manner using $$c_{2,L}(k+1) = c_{2,L}(k) - \lambda \cdot \Delta c_{2,L}(k) \qquad \text{(Eq. 21)}$$

where k is the iteration counter and $\lambda$ is a convergence constant ($0 < \lambda <= 1$).

One potential problem with the direct implementation of the LMS estimator is that the compensation favors portions of the spectrum with large error power. Unfortunately, this corresponds, typically, to the bandwidth spanning the linear signal. In general, distortion in this area is not of significant importance because it is masked by the linear signal. In contrast, spectral regrowth outside the linear signal bandwidth is important and needs to be minimized. Typically constraints on such distortion outside the signal bandwidth (or spectral mask) are much more stringent than within the bandwidth due to government regulations of wireless carriers.

To reduce the influence of the error located within the linear signal bandwidth, the error sequence and the third-order sub-sequences are preferably modified using a linear operation, such as a filter. Since the coefficients are constants, a linear operator, denoted by $f_{linear}( )$, can be applied to each third-order sub-sequences separately (exploiting superposition, see FIG. 8): that is, $$f_{linear}\{\varepsilon(mT)\} = \sum_L \Delta c_{2,L} \bullet f_{linear}\{\gamma(mT, L\Omega)\}. \qquad \text{(Eq. 22)}$$

An example of a linear operation is an FIR (Finite Impulse Response) filter whose kernel, $h_{estimator}(mT)$, preferably notches the linear signal response and highlights the critical portion of the spectrum (as specified by the relevant standards):

$$f_{linear}\{\varepsilon(mT)\} = \sum_k \varepsilon(kT) \cdot h_{estimator}(mT - kT). \quad \text{(Eq. 23)}$$

Other linear operations, such IIR filters, can also be used in (Eq. 22).

Thus, to improve the distortion cancellation in a specific portion of the spectrum, the following are substituted into (Eq. 19):

$$\epsilon_v = [f_{linear}\{\epsilon(mT-m_oT)\} \ldots f_{linear}\{\epsilon(mT)\}]^T \quad \text{(Eq. 24)}$$

and $$\gamma_v = \begin{bmatrix} f_{linear}\{\gamma(mT - m_oT, -2\Omega)\} & \ldots & f_{linear}\{\gamma(mT, -2\Omega)\} \\ f_{linear}\{\gamma(mT - m_oT, 0)\} & \ldots & f_{linear}\{\gamma(mT, 0)\} \\ f_{linear}\{\gamma(mT - m_oT, 2\Omega)\} & \ldots & f_{linear}\{\gamma(mT, 2\Omega)\} \end{bmatrix}. \quad \text{(Eq. 25)}$$

Figure 8:
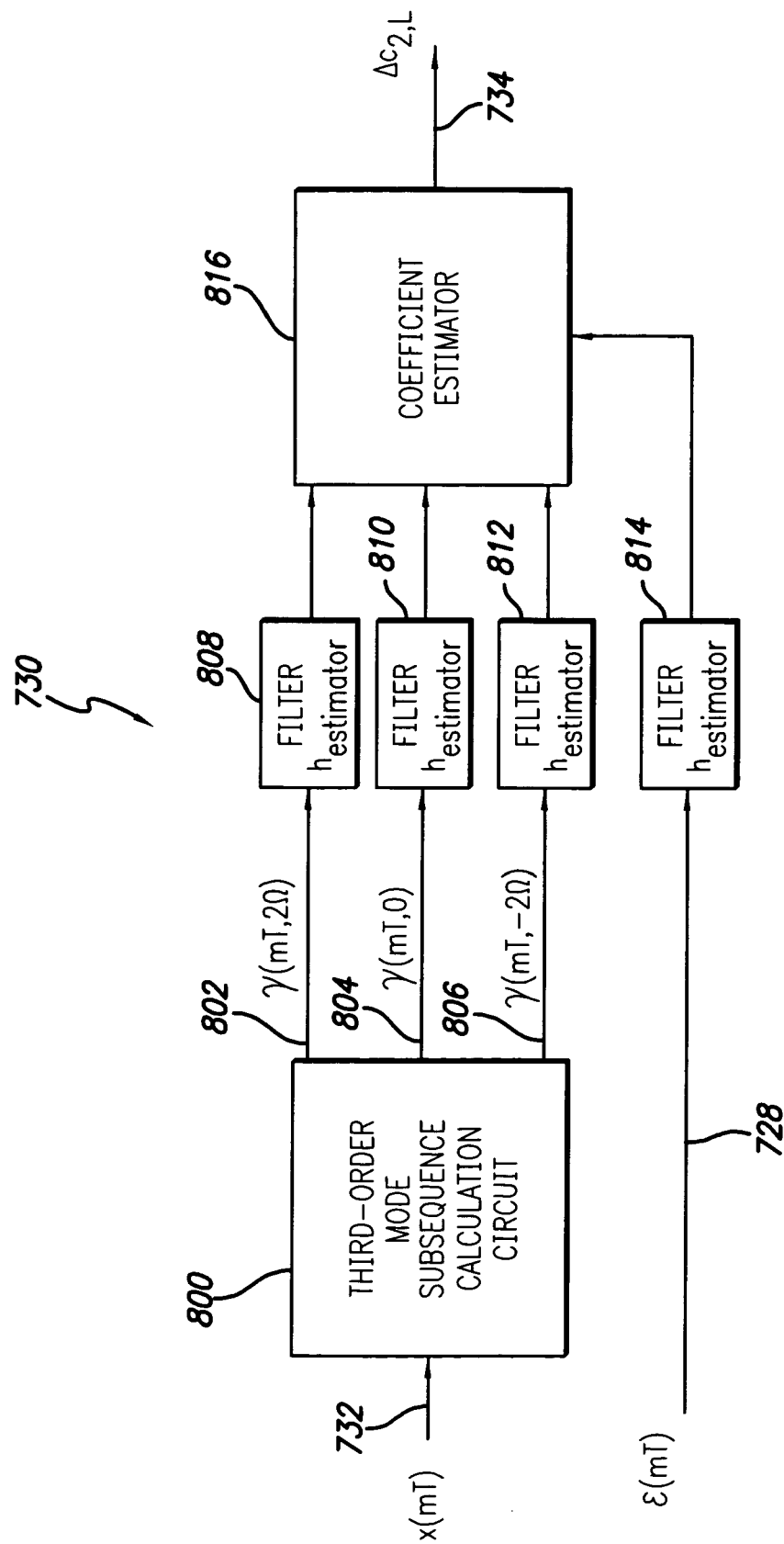
FIG. 8 is a block schematic drawing of an adaptive coefficient generator employed in the power amplifier system of FIG. 7 in accordance with a preferred embodiment of the present invention.
Figure 9:
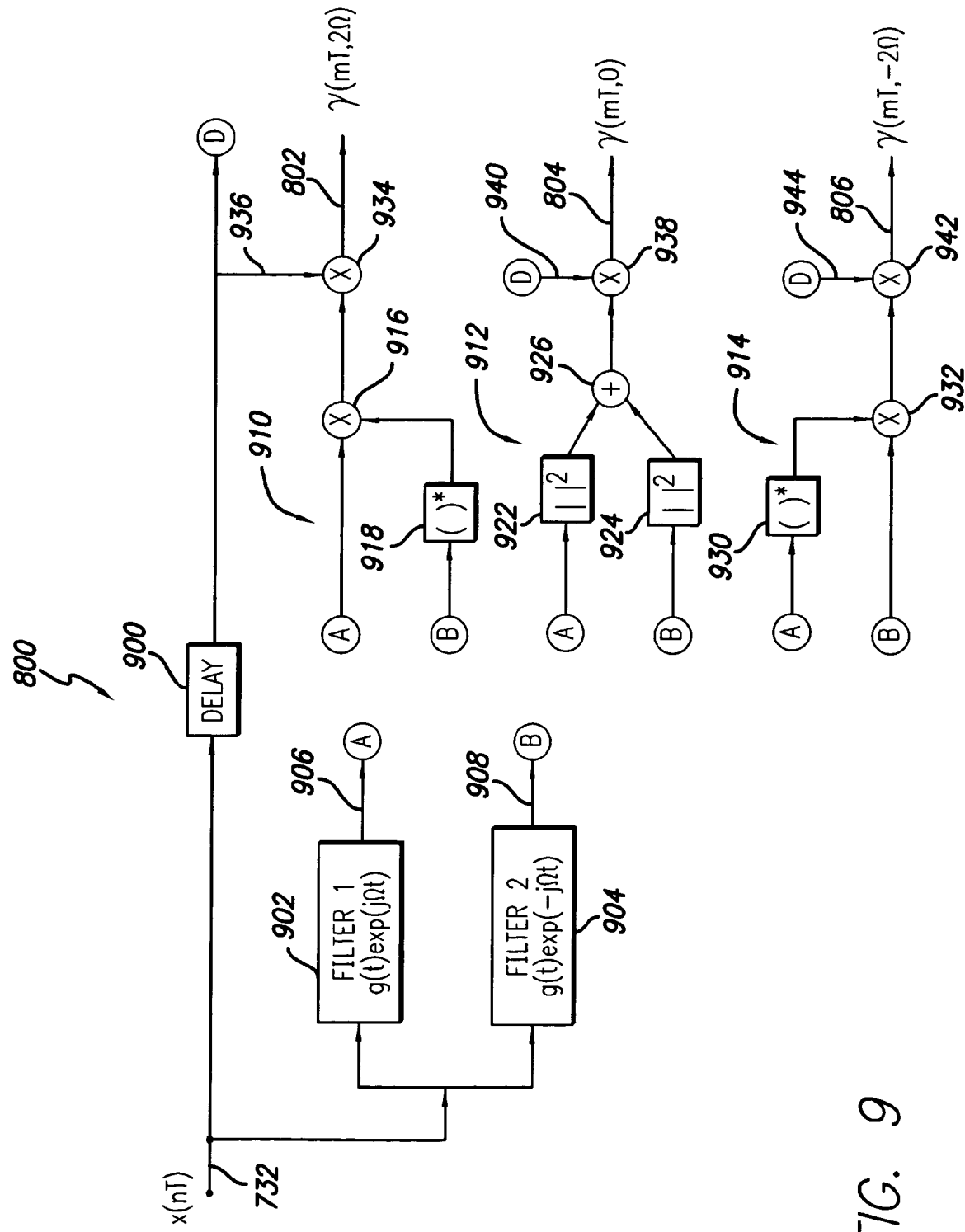
FIG. 9 is a block schematic drawing of a preferred embodiment of the third-order mode subsequence calculation circuit employed in FIG. 8 in an implementation using the embodiment of the memory digital predistortion circuit shown in FIG. 5.
Figure 10:
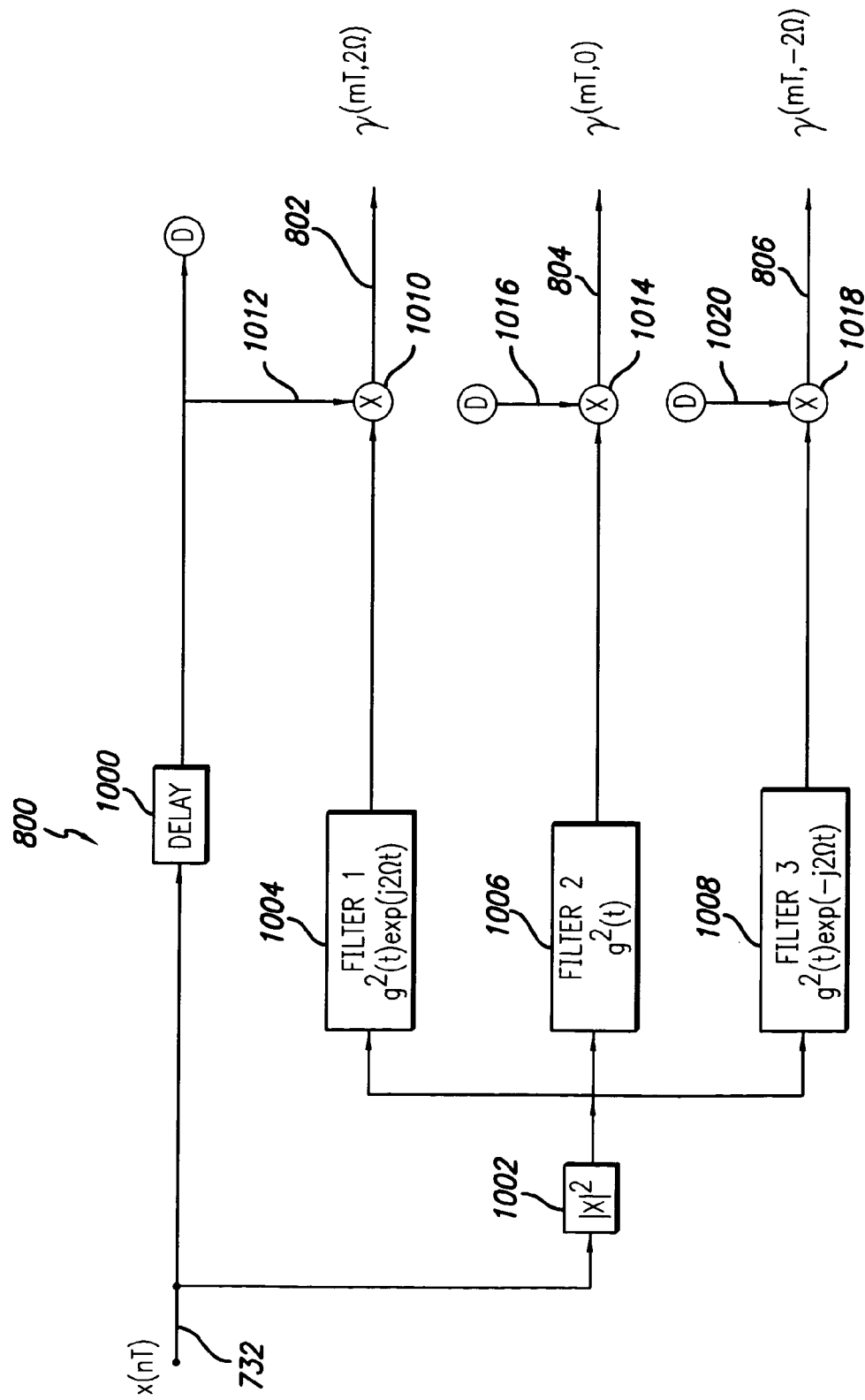
FIG. 10 is a block schematic drawing of a preferred embodiment of the third-order mode subsequence calculation circuit employed in FIG. 8 in an implementation using the embodiment of the memory digital predistortion circuit shown in FIG. 6.

Referring to FIG. 8, a preferred embodiment of the adaptive coefficient generator 730 is illustrated adapted for updating the coefficients of the memory DPD circuit using the above described theory of coefficient calculation. More specifically, as shown in FIG. 8, the adaptive coefficient generator 730 receives the input signal appropriately delayed along line 732 and the normalized error signal along line 728. The input signal along line 732 is provided to a third-order mode subsequence calculation circuit 800. The third-order mode subsequence calculation circuit 800 has a structure similar to the memory DPD circuit 118 (of FIG. 1), third-order examples of which are shown in FIG. 5 and FIG. 6 described above. (The third-order mode subsequence calculation circuit 800 used with the pre-filtering implementation (FIG. 5) is shown in FIG. 9, described below. The third-order mode subsequence calculation circuit 800 used with the post-filtering implementation (FIG. 6) is shown in FIG. 10, described below.) The third-order sub-sequences, derived from the input signal, are provided along lines 802, 804 and 806 to filters 808, 810, and 812. As noted above filters 808, 810, and 812 may preferably be FIR (Finite Impulse Response) filters whose kernel, $h_{estimator}(mT)$, preferably notches the linear signal response and highlights the critical portion of the spectrum (as specified by the relevant standards). The outputs of filters 808, 810, and 812 are provided to coefficient estimator 816. Coefficient estimator 816 also receives an input corresponding to the error signal along 728 filtered by filter 814 which should correspond to filters 808, 810 and 812 and also may preferably be a FIR filter with appropriately chosen kernel. Coefficient estimator 816 then computes the error in the coefficients using equation (19) above. For example, coefficient estimator 816 may be a suitably programmed DSP which implements equation (19) or may be a hardware arithmetic circuit implementation. Also, if a DSP implementation is chosen the other functional blocks in FIG. 8 may also be suitably implemented as software in the DSP. Since, as noted above, the operation of the adaptive coefficient generator 730 may be in a batch processing mode the DSP functionality may be easily shared with other functions. The coefficient error computed by the coefficient estimator 816 is output on line 734 as illustrated and used to update the coefficients employed in the memory DPD circuitry as described above in relation to FIG. 7.

Referring to FIG. 9, a first preferred embodiment of the third-order mode subsequence calculation circuit 800 is illustrated. As shown, the circuit 800 receives the input signal along line 732 and provides it along a first path including delay circuit 900. The input signal is also provided along a second path to a filter bank comprising first filter 902 and second filter 904. These filters may implement the same functional operations as the filters described previously in relation to FIG. 5. More specifically first filter 902 and second filter 904 have different fixed frequency responses (such as images of each other) and split the input signal into two band limited components (denoted A and B) provided along lines 906 and 908. The two components A and B are provided to three separate signal paths 910, 912 and 914 comprising nonlinear operation circuits. In these signal paths auto- and cross-terms are computed producing sub-sequences concentrated in three different parts of the spectrum. More specifically, in signal path 910 the complex conjugate of the signal B is computed at 918 and multiplied with the signal A at complex multiplication circuit 916. In signal path 912, the signals A and B are provided to circuits 922 and 924, respectively, which compute the magnitude squared of the respective signals, which are then added at addition circuit 926. In signal path 914, the input signal A is provided to complex conjugate circuit 930, the output of which is then multiplied with the signal B at complex multiplication circuit 932. The subsequences generated in signal paths 910, 912 and 914 are then combined with the delayed input signal D to generate the third-order sub-sequences illustrated in FIG. 8 provided along lines 802, 804 and 806. More specifically, the output of the signal path 910 is combined at complex multiplication circuit 934 with the delayed input signal D on line 936 to generate the third order subsequence provided along line 802. The output of signal path 912 is provided to complex multiplication circuit 938 and multiplied with the delayed input signal D provided along line 940 to generate the third order subsequence provided on line 804. The output of signal path 914 is provided to complex multiplication circuit 942 and multiplied with the delayed input signal D provided along line 944 to generate the third order subsequence on line 806. As noted above in relation to FIG. 8, the circuitry illustrated in FIG. 9 may be implemented in a suitably programmed DSP due to the batch mode processing of the coefficient update processing whereas the corresponding circuitry of FIG. 5 is preferably implemented in hardware, such as an ASIC or FPGA circuit, in order to provide the real-time DPD processing.

Referring to FIG. 10, a second embodiment of the third-order mode subsequence calculation circuit 800 is illustrated. As shown, the circuit 800 receives the input signal along line 732 and provides it along a first path including delay circuit 1000. The input signal is also provided along a second path to nonlinear operation circuit 1002, which computes the magnitude squared of the input signal. The magnitude squared signal is then provided to a filter bank comprising first filter 1004, second filter 1006 and third filter 1008. The filters 1004, 1006 and 1008 create the desired band limited sub-sequences and these filters may implement the same functional operations as the filters described previously in relation to FIG. 6. The sub-sequences are then provided to respective combining circuits and combined with the delayed input signal D to generate the third-order sub-sequences illustrated in FIG. 8 provided along lines 802, 804 and 806. More specifically, the output of the first filter 1004 is provided to complex multiplication circuit 1010 and multiplied with the delayed input signal D provided along line 1012 to generate the third order subsequence provided on line 802. The output of the second filter 1006 is provided to complex multiplication circuit 1014 and multiplied with the delayed input signal D provided along line 1016 to generate the third order subsequence provided on line 804. The output of the third filter 1008 is provided to complex multiplication circuit 1018 and multiplied with the delayed input signal D provided along line 1020 to generate the third order subsequence provided on line 806.

Next the second embodiment of memory DPD circuit 118, which transforms odd-order nonlinear sub-signals into a joint time-frequency representation, will be described. First the theory of operation of the memory effect compensation in the second embodiment of memory DPD circuit 118 will be described (specific implementations will be described in detail below in relation to FIGS. 11 and 12).

Consider a third-order nonlinearity written using (Eq. 4) for both $|x(t)|^2$ and $x(t)$:

$$x(t) \cdot |x(t)|^2 = \sum_L \sum_k z_L\left(\frac{kT}{3}\right) \cdot g^3\left(t - \frac{kT}{3}\right) \cdot \exp(jL \cdot \Omega \cdot t) \quad \text{(Eq. 26)}$$

where $L = q_1 + q_2 - q_3$, $k = n_1 + n_2 + n_3$, and $$z_L\left(\frac{kT}{3}\right) = \sum_{n(1)} \sum_{n(2)} \sum_{n(3)} \left[ y_{q(1)}(n_1 T) y_{q(2)}(n_2 T) y_{q(3)}^*(n_3 T) \right] \cdot \exp\left\{ -\frac{\alpha \cdot \Delta_n^2 T^2}{3} \right\} \quad \text{(Eq. 27)}$$

$$g^3(t) = [g(t)]^3 \quad \text{(Eq. 28)}$$

$$\Delta_n^2 = (n_1 - n_2)^2 + (n_1 - n_3)^2 + (n_2 - n_3)^2. \quad \text{(Eq. 29)}$$

From (Eq. 26), it can be seen that the third-order term comprises the weighted sum of frequency-offset basis functions:

$$\beta_3(kT, L\Omega) = g^3\left(t - \frac{kT}{3}\right) \cdot \exp(jL \cdot \Omega \cdot t). \quad \text{(Eq. 30)}$$

Note the sub-sequence $z_L(kT/3)$ is oversampled by a factor of 3 relative to the original sequence $y_q(nT)$. The requirement for oversampling by a factor of 3 or more is not explicit within the first embodiment described above in relation to FIGS. 5 and 6; however, the 3 times oversampling is preferred once the power envelope is remodulated with the linear signal. For the filter bank implementation, the oversampling by 3 is also provided, preferably at the input.

As was the case for first embodiment, the time shift associated with memory effects alters each basis function, primarily, by a phase shift: that is, $$\beta_3(kT + \delta\tau, L\Omega) \approx \beta_3(kT, L\Omega) \cdot \exp(jL \cdot \Omega \cdot \delta\tau). \quad \text{(Eq. 31)}$$

The phase offset term, $L\Omega\delta\tau$, can be incorporated into the coefficients of the Taylor series: from (Eq. 1), (Eq. 26), (Eq. 30), and (Eq. 31), we get $$x_{NL}(t) = x(t) + \sum_L c_{3,L} \sum_k z_L\left(\frac{kT}{3}\right) \cdot \beta_3(kT, L\Omega) \quad \text{(Eq. 32)}$$

where the coefficients $c_{3,L}$ are $$c_{3,L} = a_3 \cdot \exp(jL \cdot \Omega \cdot \delta\tau). \quad \text{(Eq. 33)}$$

As in the first embodiment, the second embodiment can be implemented in three different ways. Specifically, the second embodiment can be implemented as follows: (1) directly using (Eq. 26) and (Eq. 27) in a suitably implemented circuit or high speed DSP; (2) by pre-filtering to split the input signal into components then computing the third-order products; or (3) by post-filtering after applying the nonlinear operation on the input signal (i.e., $|x|^2 x$). As was the case in the first embodiment, the direct implementation approach (1) is straightforward to implement but is not preferred due to the complexity of the processing involved. The second implementation is illustrated in FIG. 11 and the third implementation is illustrated in FIG. 12.

Figure 11:
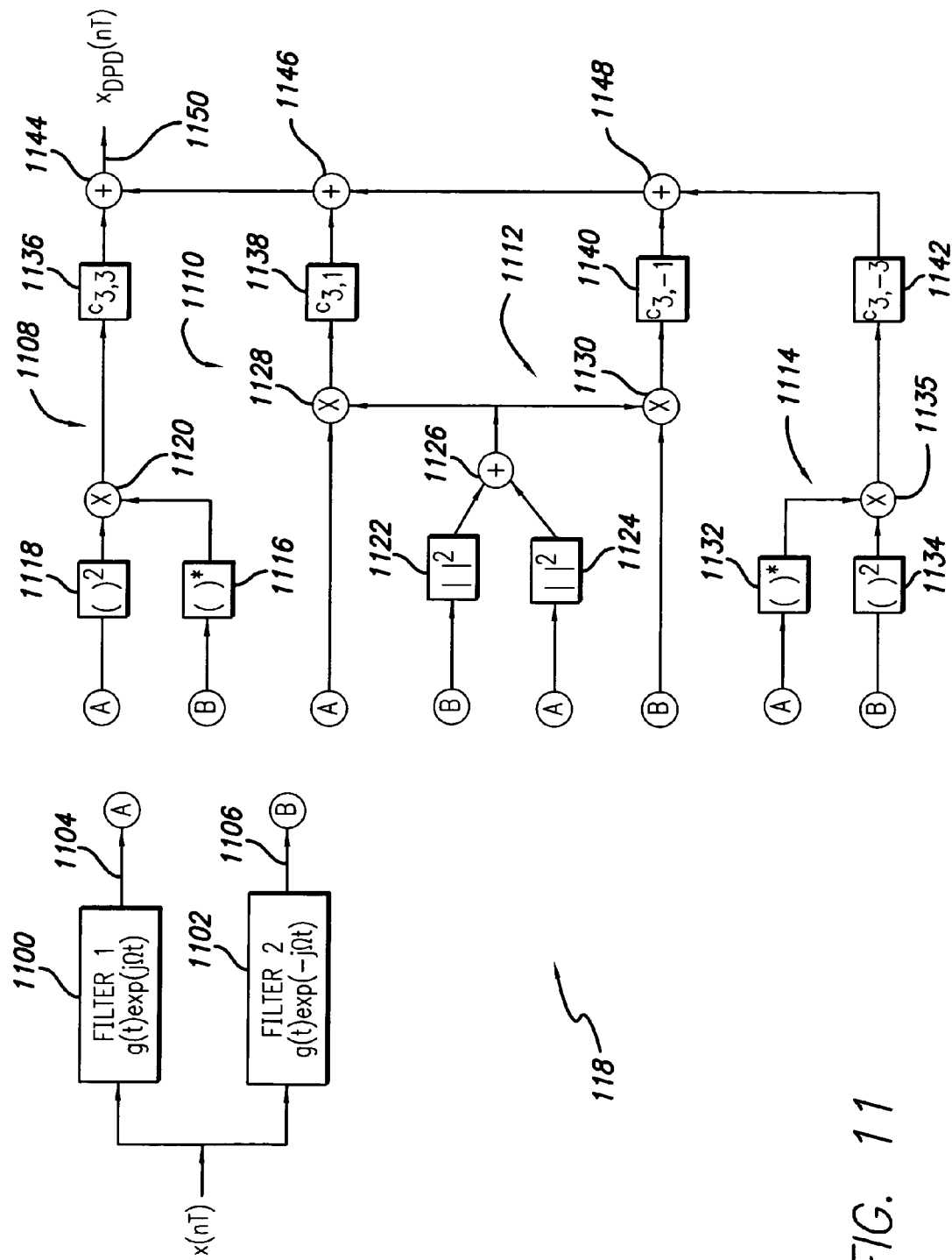
FIG. 11 is a block schematic drawing of a second embodiment of the memory digital predistortion circuit employed in the power amplifier system FIG. 1 and FIG. 7.

Referring to FIG. 11 a specific embodiment of the above noted second implementation of memory DPD circuitry 118 is shown. As generally noted above this implementation employs pre-filtering to split the input signal into band limited components and then the third-order products are computed. More specifically, as shown in FIG. 11 the input signal is provided to a filter bank comprising first and second filters 1100 and 1102 which create the joint time-frequency representation of the input signal, using Gaussian functions g(t) as described above, and split the input signal into two band limited components (denoted A and B) provided along lines 1104 and 1106. As in the first embodiment the frequency bands passed by filters 1100 and 1102 will be chosen based on the spectral characteristics of the input signal and the expected nonlinear modes generated by the power amplifier or the spectral mask for the specific cellular application. Also, as before the two filters have different frequency responses, which may be image frequency responses as illustrated. The two band limited components A and B are provided to four separate signal paths 1108, 1110, 1112 and 1114 comprising nonlinear operation circuits. In these signal paths third order nonlinear sub-sequences concentrated in different parts of the spectrum are generated. More specifically, in signal path 1108 the magnitude squared of signal A is computed at circuit 1118 and the complex conjugate of the signal B is computed at circuit 1116 and the resulting signals are multiplied at complex multiplying circuit 1120 to create a third order subsequence which is applied to weighting circuit 1136. In signal path 1110 the signals A and B are provided to circuits 1122 and 1124, respectively, which compute the magnitude squared of the respective signals, which are then added at addition circuit 1126. The output of addition circuit 1126 is then applied to complex multiplication circuit 1128 and multiplied with the signal A to create a third order subsequence which is applied to weighting circuit 1138. In signal path 1112 the output of addition circuit 1126 is applied to complex multiplication circuit 1130 and multiplied with the signal B to create a third order subsequence which is applied to weighting circuit 1140. In signal path 1114, the magnitude squared of signal B is computed at circuit 1134 and the complex conjugate of the signal A is computed at circuit 1132 and the resulting signals are multiplied at complex multiplying circuit 1135 to create a third order subsequence which is applied to weighting circuit 1142. By applying complex weights to the sub-sequences, at weighting circuits 1136, 1138, 1140 and 1142, the frequency response becomes adjustable, which in turn provides the capability for selectively compensating for memory effects. The coefficients to the weighting circuits 1136, 1138, 1140, and 1142 may be selected (referred to as "selective weighting") so that the corrected output signal has the maximum margin relative to the spectral mask (the amount that the corrected PA output spectrum is below the spectral mask specification), the minimum distortion outside of the bandwidth of the linear signal, or minimum distortion power, and such weighting may be adaptively provided as described herein. For the first two criteria, the cross-term sub-sequences provided on signal paths 1108 and 1114 tend to be the most important for the purpose of memory correction because the important spectral regrowth occurs outside of the original linear signal bandwidth. The respective weighted subsequences are combined at addition circuits 1148, 1146 and 1144 to provide the memory DPD correction along line 1150.

Figure 12:
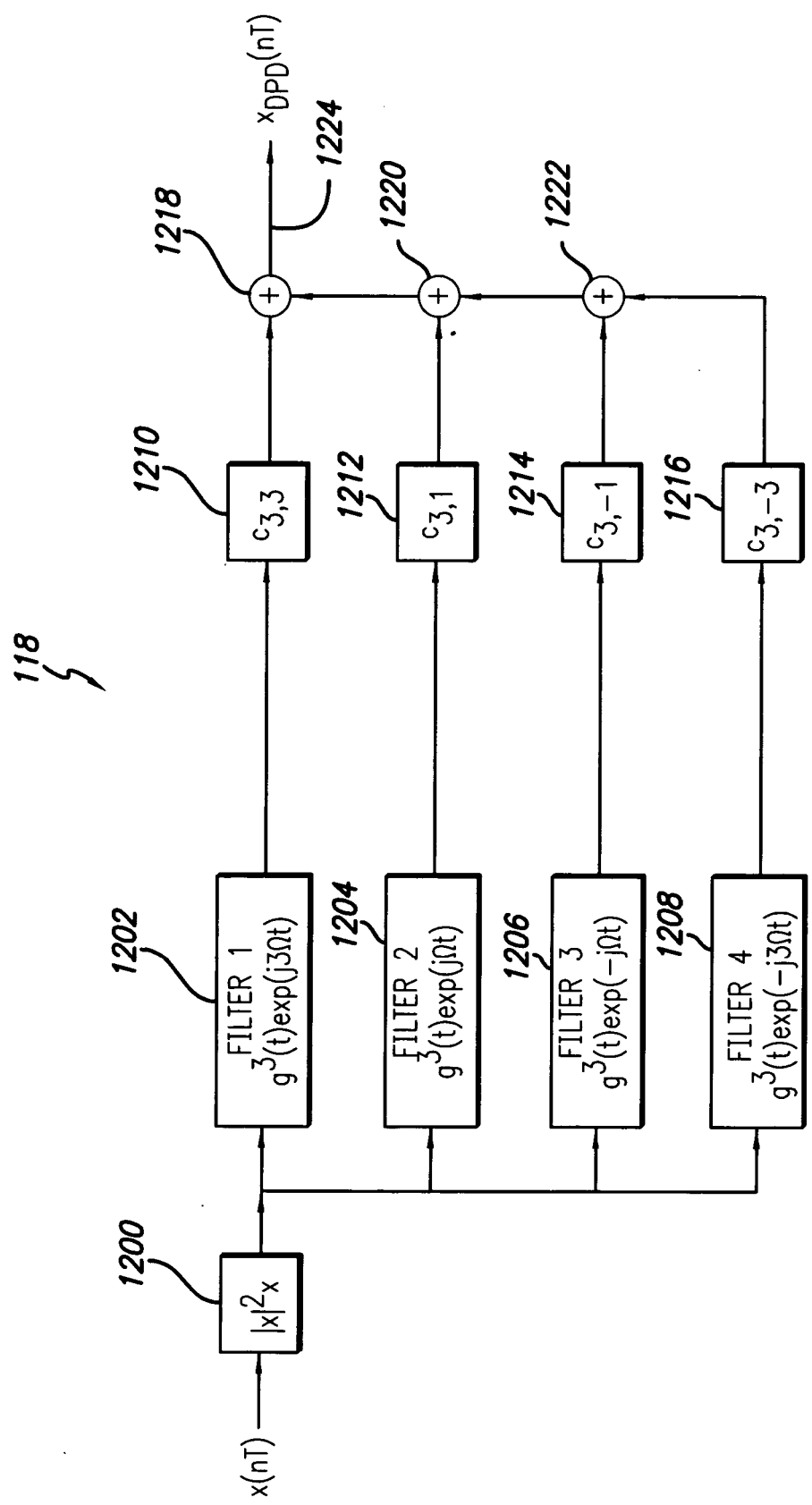
FIG. 12 is a block schematic drawing of an alternate implementation of the second embodiment of the memory digital predistortion circuit employed in the power amplifier system of FIG. 1 and FIG. 7.

Referring to FIG. 12 another specific implementation of the above described second embodiment of memory DPD circuitry 118 is shown. As generally noted above this implementation employs post-filtering after applying the nonlinear operation on the input signal (i.e., $|x|^2x$). More specifically, as shown in FIG. 12 the input signal is provided to nonlinear operation circuit 1200 which creates a third order signal from the input signal by performing the operation $|x|^2x$. The output signal from circuit 1200 is provided to a filter bank comprising filters 1202, 1204, 1206, and 1208. These filters implement a band limiting operation on the third order signal from circuit 1200 and also provide the Gaussian weighting to the third order signal with different frequency responses as indicated. The outputs of filters 1202, 1204, 1206 and 1208 thus comprise third order subsequences which are band limited based on the spectral characteristics of the input signal and the expected nonlinear modes generated by the power amplifier or the specific spectral mask of the particular cellular application. The outputs of filters 1202, 1204, 1206 and 1208 are provided to respective weighting circuits 1210, 1212, 1214 and 1216 which implement the appropriate weighting coefficients. Preferably these coefficients are chosen to weight the subsequences corresponding to spectral regrowth outside the spectral mask with a higher predistortion accuracy and such weighting may be adaptively provided as described herein. The weighted nonlinear subsequences are then provided from the weighting circuits to combining circuits 1222, 1220 and 1218, preferably comprising complex addition circuits as shown, to provide a memory digital predistortion correction signal along line 1224.

Figure 13:
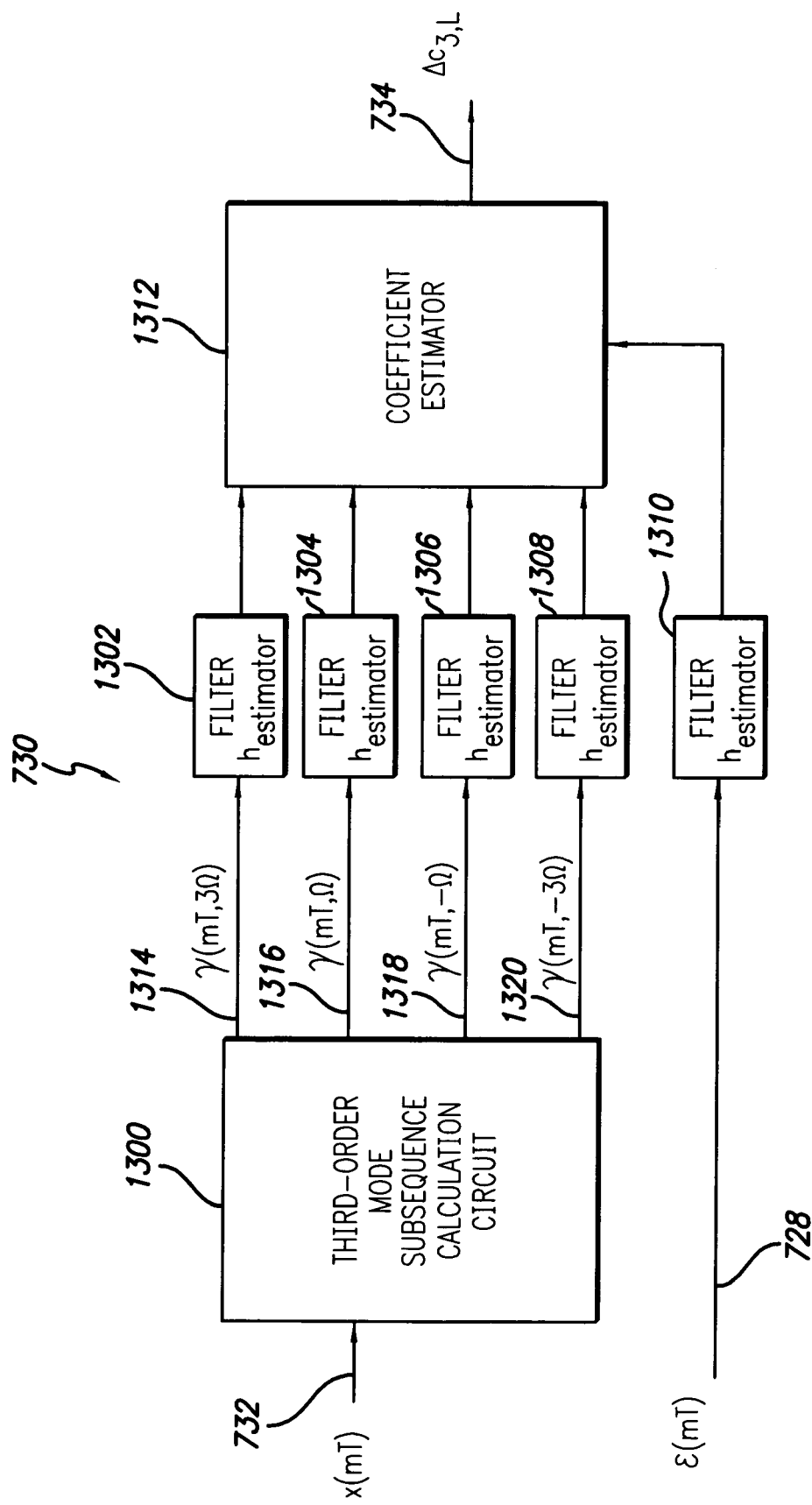
FIG. 13 is a block schematic drawing of an adaptive coefficient generator employed in the power amplifier system of FIG. 7 in accordance with an implementation using the embodiment of the memory digital predistortion circuit shown in FIG. 11 or 12.

As in the case of the first embodiment of the memory DPD circuitry 118 described in relation to FIGS. 5 and 6, the implementations of the second embodiment illustrated in FIGS. 12 and 13 can also be suitably incorporated in an adaptive embodiment corresponding to the power amplifier system of FIG. 7. The adaptive coefficient generator 730 of FIG. 7 will be modified using the above described theory of coefficient calculation for the second embodiment. A specific implementation of the adaptive coefficient generator 730 employed for the adaptive estimation of the coefficients $c_{3,L}$ is shown in FIG. 13. Similarly to the first embodiment, it uses filtering to enhance the accuracy of the estimation within the spectrum of interest and provides increased DPD correction for distortion outside the frequency band of the input signal relative to distortion within the band.

Figure 14:
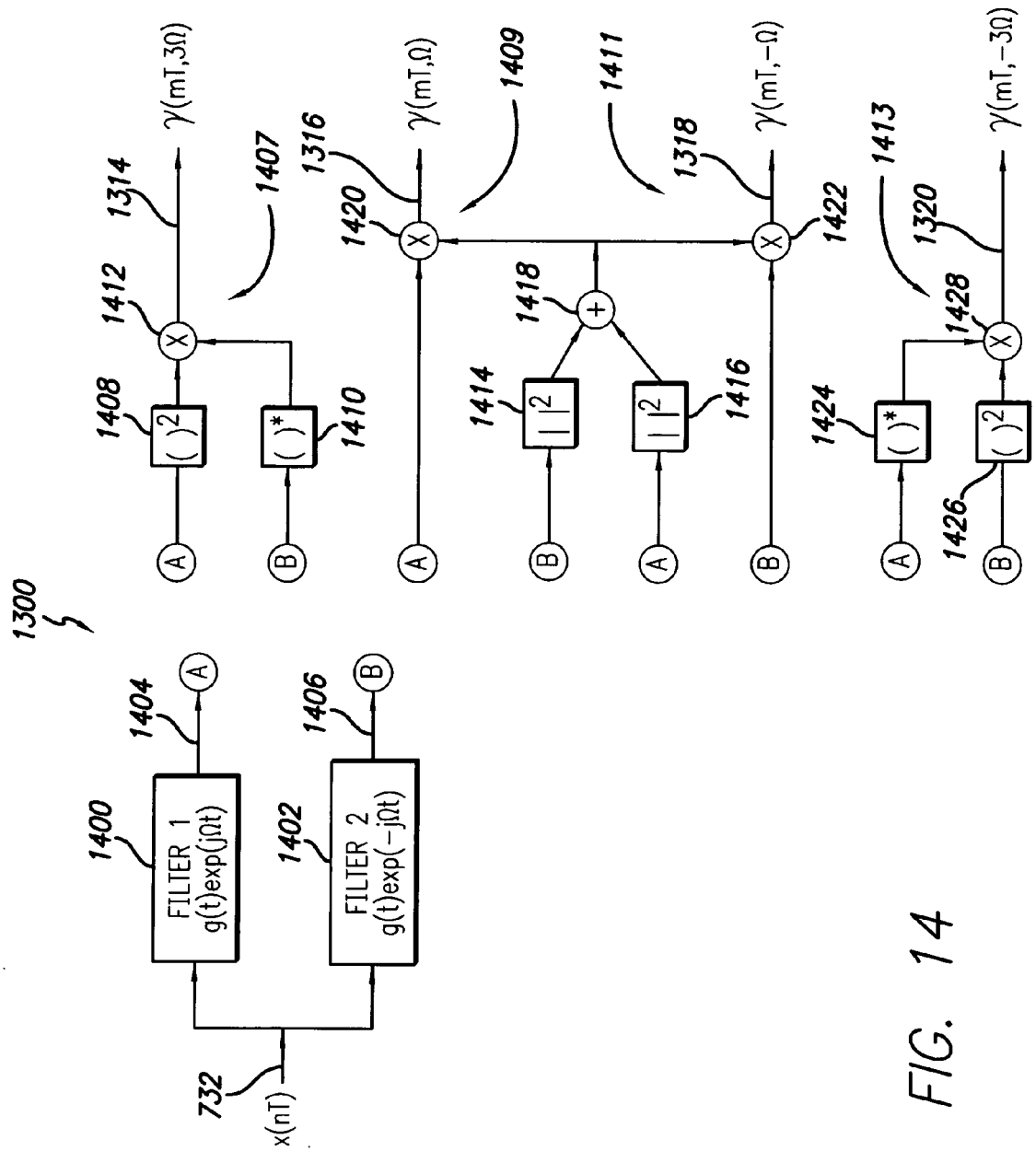
FIG. 14 is a block schematic drawing of a preferred embodiment of the third-order mode subsequence calculation circuit employed in FIG. 13 in an implementation using the embodiment of the memory digital predistortion circuit shown in FIG. 11.
Figure 15:
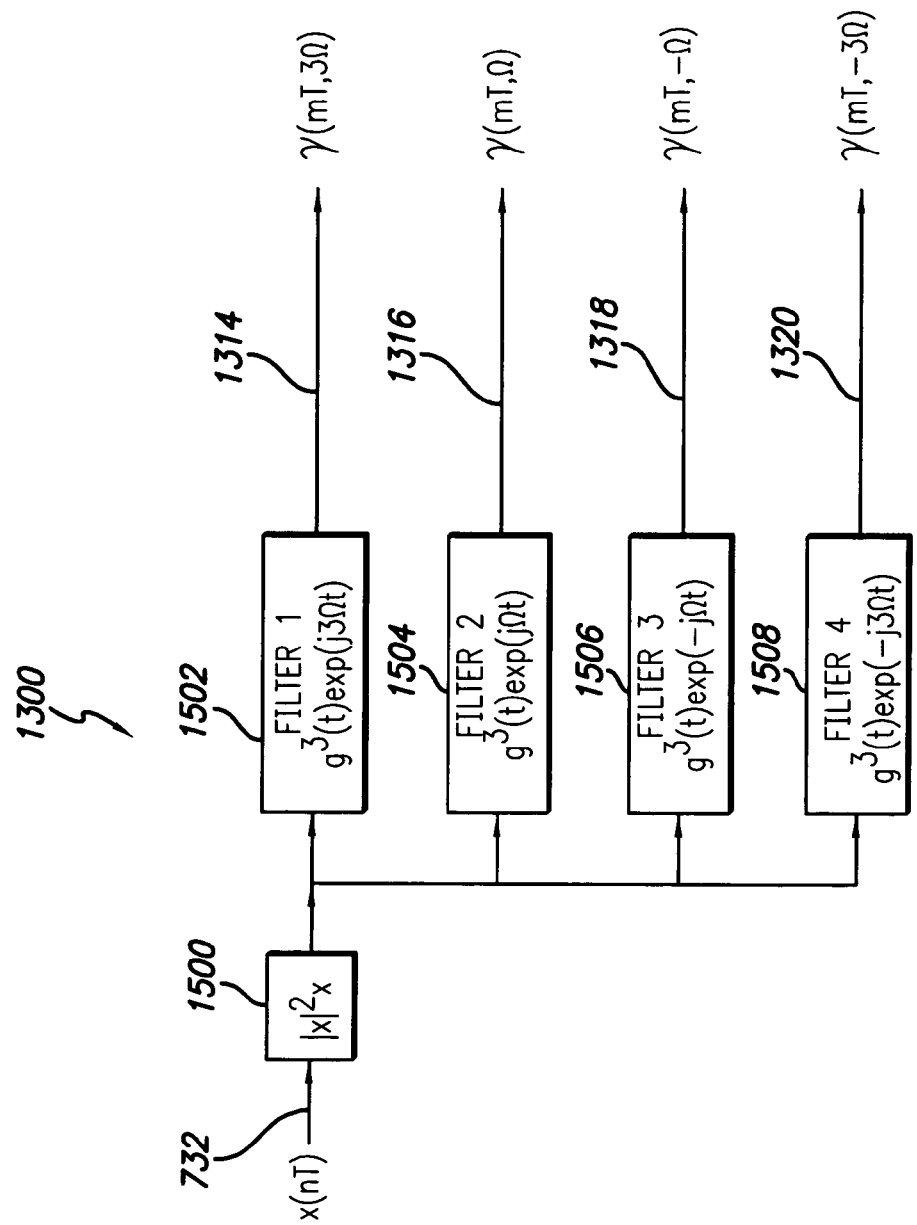
FIG. 15 is a block schematic drawing of a preferred embodiment of the third-order mode subsequence calculation circuit employed in FIG. 13 in an implementation using the embodiment of the memory digital predistortion circuit shown in FIG. 12.

Referring to FIG. 13, a specific implementation of the adaptive coefficient generator 730 for the second embodiment of the memory DPD circuitry is shown. The input signal is provided along line 732 (corresponding to the delayed input signal of FIG. 7 described above) to third-order mode subsequence calculation circuit 1300. The third-order mode subsequence calculation circuit 1300 has a structure similar to the circuitry implementing the third-order DPD computation shown in FIG. 11 and FIG. 12. (A specific implementation of the third-order mode subsequence calculation circuit 1300 used with the pre-filtering implementation (FIG. 11) is shown in FIG. 14 described below. A specific implementation of the third-order mode subsequence calculation circuit 1300 used with the post-filtering implementation (FIG. 12) is shown in FIG. 15 described below.) The outputs of the third-order mode subsequence calculation circuit 1300 are provided along lines 1314, 1316, 1318, and 1320 to respective filters 1302, 1304, 1306 and 1308. As in the first embodiment filters 1302, 1304, 1306 and 1308 may preferably be FIR (Finite Impulse Response) filters whose kernel, $h_{estimator}(mT)$, preferably notches the linear signal response and highlights the critical portion of the spectrum (as specified by the relevant standards). The outputs of the filters 1302, 1304, 1306 and 1308 are provided to coefficient estimator circuit 1312. Coefficient estimator 1312 also receives an input corresponding to the error signal along 728 filtered by filter 1310 which also may preferably be a FIR filter with appropriately chosen kernel. Coefficient estimator 1312 then computes the error in the coefficients using equation (19) above. As in the first embodiment, coefficient estimator 1312 may be a suitably programmed DSP which implements equation (19) or may be a hardware implementation. Also, if a DSP implementation is chosen the other functional blocks in FIG. 13 may also be suitably implemented as software in the DSP. The coefficient error computed by the coefficient estimator 1312 is output on line 734 as illustrated and used to update the coefficients employed in the memory DPD circuitry as described above in relation to FIG. 7.

Referring next to FIG. 14 an implementation of the third-order mode subsequence calculation circuit 1300 used with the pre-filtering implementation of the memory DPD circuit (FIG. 11) is shown. As shown in FIG. 14 the input signal is provided to a filter bank comprising first and second filters 1400 and 1402 which split the input signal into two band limited components (denoted A and B) provided along lines 1404 and 1406. The operation of filters 1400 and 1402 will correspond to filters 1100 and 1102 (described above in relation to FIG. 11). The two band limited components A and B are provided to four separate signal paths 1407, 1409, 1411, and 1413 which include nonlinear operation circuits. In these signal paths the third order nonlinear sub-sequences provided on lines 1314, 1316, 1318, and 1320 in FIG. 13 are generated from the band limited components A and B. More specifically, in signal path 1407 the magnitude squared of signal A is computed at circuit 1408 and the complex conjugate of the signal B is computed at circuit 1410 and the resulting signals are multiplied at complex multiplying circuit 1412 to create the third order subsequence which is provided along line 1314. In signal path 1409 the signals A and B are provided to circuits 1414 and 1416, respectively, which compute the magnitude squared of the respective signals, which are then added at addition circuit 1418. The output of addition circuit 1418 is then applied to complex multiplication circuit 1420 and multiplied with the signal A to create a third-order subsequence which is provided along line 1316. In signal path 1411 the output of addition circuit 1418 is applied to complex multiplication circuit 1422 and multiplied with the signal B to create a third-order subsequence which is provided along line 1318. In signal path 1413 the magnitude squared of signal B is computed at circuit 1426 and the complex conjugate of the signal A is computed at circuit 1424 and the resulting signals are multiplied at complex multiplying circuit 1428 to create a third order subsequence which is provided along line 1320.

As in the first embodiment, the circuitry illustrated in FIG. 14 may be implemented in a suitably programmed DSP due to the batch mode processing of the coefficient update processing whereas the corresponding circuitry of FIG. 11 is preferably implemented in hardware, such as an ASIC or FPGA circuit, in order to provide the real-time DPD processing.

Referring next to FIG. 15 an implementation of the third-order mode subsequence calculation circuit 1300 used with the post-filtering implementation of the memory DPD circuit (FIG. 12) is shown. As shown in FIG. 15 the input signal is provided to circuit 1500 which creates a third order signal from the input signal provided along line 732 (FIG. 7) by performing the operation $|x|^2 x$. The output signal from circuit 1500 is provided to a filter bank comprising filters 1502, 1504, 1506, and 1508. These filters 1502, 1504, 1506, and 1508 correspond in operation to filters 1202, 1204, 1206 and 1208 described above in relation to FIG. 12 and thus provide as outputs third order subsequences which are band limited based on the spectral characteristics of the input signal and the expected nonlinear modes generated by the power amplifier or the specific spectral mask of the particular cellular application. The outputs of filters 1502, 1504, 1506, and 1508 are provided along lines 1314, 1316, 1318 and 1320 and correspond to the respective outputs of third-order mode subsequence calculation circuit 1300 shown in FIG. 13 employed in the adaptive coefficient estimation operation described previously.

Higher order compensation can be achieved by modifying the memory compensation shown FIG. 11 or FIG. 12. By modulating the output signal of the memory DPD, either 1150 or 1224, by an even-order mode of the input signal (delayed appropriately) 732, the order of the correction is increased. For example, modulating by $|x|^2$ produces a fifth-order correction. The higher-order compensation would be implemented, typically, as additional paths parallel to the third-order compensation. The estimator in FIG. 13 would be expanded to include higher-order subsequence calculation circuits, in parallel with 1300, whose higher-order subsequences are filtered using $h_{estimator}$ and provided to the coefficient estimate 1312. The higher-order subsequences can be modifications of the third-order subsequences, where the outputs 1314, 1316, 1318, and 1320 are modulated by the delayed even-order mode of the input signal 732.

For the case of the memory compensation shown in FIG. 15, an alternative form of higher-order compensation can be achieved by increasing the order of the nonlinear circuits 1200 and 1500. For example, changing the nonlinear circuits 1200 and 1500 to $|x|^4 x$ would provide fifth-order compensation.

Preferred embodiments of the present invention have been described in relation to specific implementations above. Also, the general theory of operation has been described for the different embodiments. It will be appreciated by those skilled in the art from the theory of operation of the present invention that many variations in the above specific implementations are possible, the variations of which are too numerous to describe in specific detail herein. Accordingly, the present invention should not be limited to the specific implementations described above which are purely illustrative in nature.

What is claimed is:

1. A digital predistorter adapted to receive a digital quantized, time-sampled input signal and output a predistorted digital signal, the digital predistorter comprising:
   an input coupled to receive the digital quantized, time-sampled input signal;
   a first signal path coupled to the input and comprising a delay circuit and a combiner circuit coupled to the an output of the delay circuit;
   a second signal path, coupled to the input in parallel with said first signal path, comprising a first digital predistorter circuit providing a first predistortion operation on the input signal, wherein said first digital predistorter circuit provides said first predistortion operation modeling memoryless distortion effects employing only a current sample of the digital input signal; and
   a third signal path, coupled to the input in parallel with said first and second signal path, comprising a second digital predistorter circuit providing a second different predistortion operation on the input signal, wherein said second digital predistorter circuit provides said second predistortion operation modeling memory distortion effects employing plural samples of the digital input signal;
   wherein the combiner circuit receives and combines the outputs of the first and second digital predistorter circuits with the output of the delay circuit of the first signal path to provide a predistorted digital output signal.

2. A digital predistorter as set out in claim 1, wherein said combiner circuit comprises a complex addition circuit.

3. A digital predistorter as set out in claim 1, further comprising a second combiner circuit coupled to the outputs of the first and second digital predistorter circuits and providing a combined output of the first and second digital predistorter circuits to the combiner circuit in the first signal path.

4. A digital predistorter as set out in claim 3, wherein said second combiner circuit comprises a complex addition circuit.

5. A digital predistortion circuit adapted to receive a digital input signal and output a digital predistortion correction signal compensating for memory effects due to plural samples of the digital input signal, the digital predistortion circuit comprising:
   an input for receiving the digital input signal;
   a first signal path comprising a delay circuit coupled to the input and a combiner circuit coupled to an output of the delay circuit;
   a filter bank, coupled to the input and configured in parallel with the first signal path, the filter bank comprising at least two filters having different frequency responses and outputting at least first and second band limited signals derived from plural samples of the digital input signal; and
   a plurality of nonlinear operation circuits coupled to the filter bank and receiving the band limited signals, the nonlinear operation circuits creating higher order signals from the band limited signals;
   wherein the outputs of the nonlinear operation circuits are provided to the combiner circuit in the first signal path and combined with the delayed input signal output from the delay circuit in the first signal path to provide a digital predistortion output signal.

6. A digital predistortion circuit as set out in claim 5, further comprising a plurality of weighting circuits coupled to the outputs of the nonlinear operation circuits and applying respective weighting coefficients to the higher order signals.

7. A digital predistortion circuit as set out in claim 6, wherein the digital input signal has an associated frequency bandwidth, wherein one or more of the higher order signals fall within the bandwidth of the digital input signal, and wherein the weighting coefficients apply a selective weighting for the one or more higher order signals within the bandwidth of the digital input signal.

8. A digital predistortion circuit as set out in claim 5, wherein said combiner circuit is a complex multiplication circuit and wherein the predistortion output signal output from the combiner circuit is a third order signal derived from the digital input signal and the higher order signals from the nonlinear operation circuits.

9. A digital predistortion circuit as set out in claim 5, further comprising a plurality of complex addition circuits receiving and adding the higher order signals from the plurality of nonlinear operation circuits and providing the combined higher order signals to the combiner circuit in the first signal path.

10. A digital predistortion circuit as set out in claim 5, wherein said filter bank comprises first and second filters having a first fixed frequency response and a second fixed frequency response, respectively, the second frequency response comprising an image of the first frequency response.

11. A digital predistortion circuit as set out in claim 10, wherein said plurality of nonlinear operation circuits comprises:
   a first nonlinear operation circuit comprising a first complex conjugation circuit receiving an output of the second filter and a first complex multiplication circuit receiving an output of the first complex conjugation circuit and an output of the first filter and providing a first higher order signal;
   a second nonlinear operation circuit comprising first and second magnitude squared circuits receiving the outputs of the first and second filter, respectively, and an addition circuit adding the outputs of the first and second magnitude squared circuits and providing an output as a second higher order signal; and
   a third nonlinear operation circuit comprising a second complex conjugation circuit receiving the output of the first filter and a second complex multiplication circuit multiplying the output of the second complex conjugation circuit and the output of the second filter to provide a third higher order signal.

12. A digital predistortion circuit adapted to receive a digital input signal and output a digital predistortion signal compensating for memory effects due to plural samples of the digital input signal, the digital predistortion circuit comprising:
   an input for receiving the digital input signal;
   a first signal path comprising a delay circuit coupled to the input and a combiner circuit coupled to an output of the delay circuit;
   a nonlinear operation circuit coupled to the input and configured in parallel with the first signal path and receiving the digital input signal, the nonlinear operation circuit creating a higher order signal from the digital input signal; and
   a filter bank, coupled to the nonlinear operation circuit and receiving the higher order signal, the filter bank comprising plural filters having different frequency responses and outputting plural band limited higher order signals derived from plural samples of the higher order signal;
   wherein the outputs of the filters are provided to the combiner circuit in the first signal path and combined with the delayed input signal output from the delay circuit in the first signal path to provide a digital predistortion output signal.

13. A digital predistortion circuit as set out in claim 12, wherein said input signal is a complex signal and wherein said nonlinear operation circuit comprises a magnitude squared circuit providing a signal corresponding to the magnitude squared of the complex digital input signal.

14. A digital predistortion circuit as set out in claim 12, further comprising a plurality of weighting circuits coupled to the outputs of the plural filters and applying respective weighting coefficients to the band limited higher order signals.

15. A digital predistortion circuit as set out in claim 14, wherein the digital input signal has an associated frequency bandwidth, wherein one or more of the band limited higher order signals fall within the bandwidth of the digital input signal, and wherein the weighting coefficients apply a selective weighting for the one or more higher order signals within the bandwidth of the digital input signal.

16. A digital predistortion circuit as set out in claim 12, wherein said combiner circuit is a complex multiplication circuit and wherein the predistortion output signal output from the combiner circuit is a third order signal derived from the digital input signal and the band limited higher order signals.

17. A digital predistortion circuit as set out in claim 12, further comprising a plurality of complex addition circuits receiving and adding the band limited higher order signals and providing the combined band limited higher order signals to the combiner circuit in the first signal path.

18. A digital predistortion circuit as set out in claim 12, wherein said filter bank comprises first and second filters having a first fixed frequency response and a second fixed frequency response, respectively, the second frequency response comprising an image of the first frequency response, and a third filter having a different frequency response than said first and second filters.

19. A digital predistortion circuit adapted to receive a digital input signal and output a digital predistortion signal compensating for memory effects due to plural samples of the digital input signal, the digital predistortion circuit comprising:
   an input for receiving the digital input signal;
   a filter bank comprising at least two filters having different frequency responses and outputting at least first and second band limited signals derived from plural samples of the digital input signal;
   a plurality of nonlinear operation circuits coupled to the filter bank and receiving the band limited signals, the nonlinear operation circuits creating third order or higher order signals from the band limited signals; and
   one or more combiner circuits receiving and combining the outputs of the nonlinear operation circuits to provide a digital predistortion output signal.

20. A digital predistortion circuit as set out in claim 19, further comprising a plurality of weighting circuits coupled to the outputs of the nonlinear operation circuits and applying respective weighting coefficients to the higher order signals.

21. A digital predistortion circuit as set out in claim 20, wherein the digital input signal has an associated frequency bandwidth, wherein one or more of the higher order signals fall within the bandwidth of the digital input signal, and wherein the weighting coefficients apply a selective weighting for the one or more higher order signals within the bandwidth of the digital input signal.

22. A digital predistortion circuit as set out in claim 19, wherein said one or more combiner circuits comprise a plurality of complex addition circuits.

23. A digital predistortion circuit as set out in claim 19, wherein said filter bank comprises first and second filters having a first fixed frequency response and a second fixed frequency response, respectively, the second frequency response comprising the image of the first frequency response.

24. A digital predistortion circuit as set out in claim 23, wherein said plurality of nonlinear operation circuits comprises:
a first nonlinear operation circuit comprising a first complex squaring circuit receiving an output of the first filter, a first conjugation circuit receiving an output of the second filter, and a first complex multiplication circuit receiving an output of the first complex squaring circuit and the first complex conjugation circuit and providing a first higher order signal;
a second nonlinear operation circuit comprising first and second magnitude squared circuits receiving the outputs of the first and second filter, respectively, an addition circuit adding the outputs of the first and second magnitude squared circuits, and a second complex multiplication circuit multiplying the output of the first filter and the output of the addition circuit and providing an output as a second higher order signal;
a third nonlinear operation circuit comprising a third complex multiplication circuit receiving and multiplying the output of the second filter and the output of said addition circuit and providing an output as a third higher order signal; and
a fourth nonlinear operation circuit comprising a second complex conjugation circuit receiving the output of the first filter, a second complex squaring circuit receiving the output of the second filter, and a fourth complex multiplication circuit multiplying the output of the second complex conjugation circuit and the output of the second complex squaring circuit to provide a fourth higher order signal.

25. A digital predistortion circuit adapted to receive a digital input signal and output a digital predistortion signal compensating for memory effects due to plural samples of the digital input signal, the digital predistortion circuit comprising:
an input for receiving the digital input signal;
a nonlinear operation circuit coupled to the input and receiving the digital input signal, the nonlinear operation circuit creating third or higher order signals from the digital input signal;
a filter bank, coupled to the nonlinear operation circuit and receiving the third or higher order signals, the filter bank comprising plural filters having different frequency responses and outputting plural band limited third order or higher order signals derived from plural samples of the third or higher order signal; and
one or more combiner circuits receiving and combining the outputs of the filters to provide a predistortion output signal.

26. A digital predistortion circuit as set out in claim 25, wherein said digital input signal is a complex signal and wherein said nonlinear operation circuit comprises a circuit providing a third order signal corresponding to the magnitude squared of the complex digital input signal multiplied by the complex digital input signal.

27. A digital predistortion circuit as set out in claim 25, further comprising a plurality of weighting circuits coupled to the outputs of the plural filters and applying respective weighting coefficients to the band limited third order or higher order signals.

28. A digital predistortion circuit as set out in claim 27, wherein the digital input signal has an associated frequency bandwidth, wherein one or more of the band limited third order or higher order signals fall at least partially within the bandwidth of the digital input signal, and wherein the weighting coefficients apply a selective weighting for the one or more third order or higher order signals within the bandwidth of the digital input signal.

29. A digital predistortion circuit as set out in claim 25, wherein said one or more combiner circuits comprise a plurality of complex addition circuits receiving and adding the band limited third order or higher order signals.

30. A digital predistortion circuit as set out in claim 25, wherein said filter bank comprises first, second, third and fourth filters each having a different fixed frequency response.

31. An adaptive digital predistortion system adapted to receive a digital input signal and output a predistorted digital signal to a nonlinear component and to receive a digital sample of an output of the nonlinear component, the digital predistortion system comprising:
an input coupled to receive the digital input signal;
a digital predistorter module coupled to the input and comprising a predistortion circuit operating on the digital input signal to create band limited signals from the digital input signal and employing separate predistortion coefficients for weighting the band limited signals;
an error generator circuit for receiving the digital input signal and the digital sample of the output of the nonlinear component and providing a digital error signal; and
an adaptive coefficient generator coupled to receive the digital input signal and the digital error signal and comprising a spectral weighting circuit to derive separately weighted frequency components from the digital input signal and digital error signal and a coefficient estimator circuit for calculating updated predistortion coefficients weighted differently for different frequency components and providing the updated predistortion coefficients to the digital predistorter module.

32. An adaptive digital predistortion system as set out in claim 31, wherein the coefficient estimator circuit comprises a weighted least mean square coefficient estimator.

33. An adaptive digital predistortion system as set out in claim 32, wherein the coefficient estimator circuit comprises a digital signal processor programmed with a weighted least mean square algorithm.

34. An adaptive digital predistortion system as set out in claim 31, wherein the spectral weighting circuit comprises a plurality of digital filters receiving and operating on the digital input signal and the digital error signal.

35. An adaptive digital predistortion system as set out in claim 31, wherein the spectral weighting circuit further comprises a subsequence calculation circuit for deriving frequency limited subsequences from the digital input signal and wherein one of the plurality of digital filters receive and operate on the digital error signal and the remaining ones of the plurality of digital filters receive and operate on the frequency limited subsequences.

36. A linearized amplifier system adapted to receive a digital input signal and output an amplified RF signal, comprising:
an input coupled to receive the digital input signal;
a digital predistorter module comprising a first signal path coupled to the input and comprising a delay circuit and a combiner circuit coupled to an output of the delay circuit, a second signal path coupled to the input in parallel with said first signal path and comprising a first digital predistorter circuit providing a memoryless predistortion operation on the input signal operating on single samples of the input signal, and a third signal path coupled to the input in parallel with said first and second signal paths and comprising a second digital predistorter circuit providing a memory based predistortion operation on the input signal employing plural samples of the input signal, wherein the combiner circuit receives and combines the outputs of the first and second digital predistorter circuits with the output of the delay circuit of the first signal path to provide a predistorted digital signal;

a digital to analog converter coupled to receive the predistorted digital signal from the digital predistorter module and provide a predistorted analog signal;

an up converter receiving the predistorted analog signal from the digital to analog converter and converting it to an RF analog signal; and a power amplifier receiving the RF analog signal and providing an amplified RF output signal.

37. An adaptively linearized amplifier system, comprising:

an input coupled to receive a digital input signal;

a digital predistorter module coupled to the input and receiving the digital input signal and outputting a predistorted digital signal, the digital predistorter module comprising a predistortion circuit operating on the digital input signal to create band limited signals from the digital input signal and employing separate predistortion coefficients for weighting the band limited signals;

a digital to analog converter coupled to receive the predistorted digital signal output of the digital predistorter module and provide an analog signal;

an up converter for receiving the analog signal from the digital to analog converter and converting the analog signal to an RF analog signal;

a power amplifier receiving the RF analog signal and providing an amplified RF output signal;

an output sampling coupler coupled to sample the analog RF output signal from the power amplifier;

a feedback circuit path, coupled to the output sampling coupler, comprising a down converter and an analog to digital converter converting the sampled RF output signal to a digital sampled signal representative of the RE output signal;

an error generator circuit coupled to the input and the feedback circuit path for receiving the digital input signal and the digital sampled signal and providing a digital error signal; and an adaptive coefficient generator, coupled to receive the digital input signal and the digital error signal and providing updated predistortion coefficients to the digital predistorter module, comprising a spectral weighting circuit to derive separately weighted frequency components from the digital input signal and digital error signal and a coefficient estimator circuit for calculating updated predistortion coefficients weighted differently for different frequency components.

38. A method for digitally predistorting a digital quantized time-sampled input signal, comprising:

receiving the digital quantized time-sampled input signal and splitting the digital input signal along three parallel signal paths;

delaying the signal provided along the first signal path;

digitally predistorting the signal provided along the second signal path employing a single sample of the digital input signal to provide a memoryless predistortion correction;

digitally predistorting the signal along the third signal path employing plural samples of the digital input signal to provide a memory based digital predistortion correction; and combining the memoryless and memory based digital predistortion corrections provided from the second and third signal paths with the delayed signal in the first signal path to provide a predistorted digital output signal.

39. A method for digitally predistorting a digital input signal, comprising:

receiving the digital input signal;

deriving a plurality of band limited higher order signals from the digital input signal;

weighting the plurality of band limited higher order signals with predistortion coefficients varying between the band limited higher order signals to provide a predistortion correction signal; and combining the predistortion correction signal with the digital input signal to provide a predistorted digital output signal.

40. A method for digitally predistorting a digital input signal as set out in claim 39, wherein deriving a plurality of band limited higher order signals from the digital input signal comprises filtering the digital input signal to create plural band limited signals and performing plural nonlinear operations on the band limited signals to create said band limited higher order signals.

41. A method for digitally predistorting a digital input signal as set out in claim 40, wherein deriving a plurality of band limited higher order signals from the digital input signal comprises performing a nonlinear operation on the digital input signal to create a higher order signal and performing plural filtering operations on the higher order signal to create said band limited higher order signals.

42. A method for digitally predistorting a digital input signal as set out in claim 40, wherein said band limited higher order signals are second order signals and wherein said method further comprises multiplying the band limited higher-order signals with the digital input signal to provide a third order digital signal as said predistortion correction signal.

43. A method for digitally predistorting a digital input signal as set out in claim 40, wherein said band limited higher order signals are third order signals.

44. A method for digitally predistorting a digital input signal as set out in claim 40, wherein the digital input signal has an associated frequency bandwidth, wherein one or more of the band limited higher order signals fall within the frequency bandwidth of the input signal, and wherein the predistortion coefficients apply a selective weighting for the one or more higher order signals within the frequency bandwidth of the input signal.

45. A method for digitally predistorting a digital input signal, comprising:

receiving the digital input signal;

deriving a plurality of higher order signals representative of nonlinear basis functions based on a joint time frequency representation of plural samples of the digital input signal;

weighting the plurality of higher order signals with predistortion coefficients to provide a predistortion correction signal; and combining the predistortion correction signal with the digital input signal to provide a predistorted digital signal.

46. A method for digitally predistorting a digital input signal as set out in claim 45, wherein said nonlinear basis functions comprise truncated Gaussian functions based on a Gabor expansion of the input signal.

47. A method for adaptive digital predistortion linearization of an amplifier system, comprising:
receiving a digital input signal;
deriving a plurality of band limited higher order signals from the digital input signal;
weighting the plurality of band limited higher order signals with spectrally weighted predistortion coefficients to provide a predistortion correction signal;
combining the predistortion correction signal with the digital input signal to provide a predistorted digital signal;
converting the predistorted digital signal from digital to analog form to provide a predistorted analog signal;
up converting the predistorted analog signal to an RF signal;
amplifying the RF signal to provide an amplified RF output signal;
sampling the RF output signal;
down converting the sampled RF output signal to a lower frequency sampled analog output signal;
converting the lower frequency sampled analog output signal to digital form to provide a sampled digital output signal;
deriving an error signal from the digital input signal and the sampled digital output signal;
deriving spectrally weighted subsignals from the error signal and the digital input signal; and
adaptively generating said spectrally weighted predistortion coefficients from the spectrally weighted subsignals.

* * * * *